(12) United States Patent
Chen et al.

(10) Patent No.: US 12,369,334 B2
(45) Date of Patent: Jul. 22, 2025

(54) METHOD OF MANUFACTURING A SEMICONDUCTOR DEVICE AND A SEMICONDUCTOR DEVICE

(71) Applicant: Taiwan Semiconductor Manufacturing Company, Ltd., Hsinchu (TW)

(72) Inventors: Ting-Yeh Chen, Hsinchu (TW); Wei-Yang Lee, Taipei (TW); Chia-Pin Lin, Xinpu Township (TW); Yuan-Ching Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/644,270

(22) Filed: Apr. 24, 2024

(65) Prior Publication Data
US 2024/0274649 A1    Aug. 15, 2024

Related U.S. Application Data

(62) Division of application No. 17/575,145, filed on Jan. 13, 2022, now Pat. No. 12,002,845.
(Continued)

(51) Int. Cl.
H01L 29/76    (2006.01)
H01L 23/64    (2006.01)
(Continued)

(52) U.S. Cl.
CPC ............ H10D 1/47 (2025.01); H01L 23/647 (2013.01); H10D 62/115 (2025.01); H10D 84/209 (2025.01)

(58) Field of Classification Search
CPC ...... H10D 1/47; H10D 62/115; H10D 84/209; H10D 30/6757; H10D 30/797;
(Continued)

(56) References Cited

U.S. PATENT DOCUMENTS 9,209,247 B2    12/2015    Colinge et al.
9,236,267 B2    1/2016    De et al.
(Continued)

OTHER PUBLICATIONS

Notice of Allowance issued in U.S. Appl. No. 17/575,145, dated Jan. 24, 2024.

*Primary Examiner* — Theresa T Doan
(74) *Attorney, Agent, or Firm* — STUDEBAKER BRACKETT PLLC

(57) ABSTRACT

In a method of manufacturing a semiconductor device, a fin structure, which includes a stacked layer of first semiconductor layers and second semiconductor layers disposed over a bottom fin structure and a hard mask layer over the stacked layer, is formed. An isolation insulating layer is formed. A sacrificial cladding layer is formed over at least sidewalls of the exposed hard mask layer and stacked layer. A first dielectric layer is formed. A second dielectric layer is formed over the first dielectric layer. The second dielectric layer is recessed. A third dielectric layer is formed on the recessed second dielectric layer. The third dielectric layer is partially removed to form a trench. A fourth dielectric layer is formed by filling the trench with a dielectric material, thereby forming a wall fin structure.

20 Claims, 17 Drawing Sheets

Related U.S. Application Data

(60) Provisional application No. 63/225,128, filed on Jul. 23, 2021.

(51) Int. Cl.
   *H01L 29/00* (2006.01)
   *H10D 1/47* (2025.01)
   *H10D 62/10* (2025.01)
   *H10D 84/00* (2025.01)

(58) Field of Classification Search
   CPC .. H10D 30/014; H10D 30/43; H10D 30/6735; H10D 64/017; H10D 62/822; H10D 62/832; H10D 62/85; H10D 62/121; H10D 62/151; H10D 84/83; H10D 84/0151; H10D 84/038; H10D 84/013; H01L 23/647; B82Y 10/00

USPC .......................................................... 257/506
   See application file for complete search history.

(56) References Cited

U.S. PATENT DOCUMENTS

| | | |
   |---|---|---|
   | 9,412,817 B2 | 8/2016 | Yang et al. |
   | 9,412,828 B2 | 8/2016 | Ching et al. |
   | 9,472,618 B2 | 10/2016 | Oxland |
   | 9,502,265 B1 | 11/2016 | Jiang et al. |
   | 9,520,482 B1 | 12/2016 | Chang et al. |
   | 9,536,738 B2 | 1/2017 | Huang et al. |
   | 9,576,814 B2 | 2/2017 | Wu et al. |
   | 9,608,116 B2 | 3/2017 | Ching et al. |
   | 9,954,113 B2* | 4/2018 | Shimomura ......... H10D 30/673 |
   | 11,437,245 B2 | 9/2022 | Fu et al. |
   | 2021/0384313 A1 | 12/2021 | Cheng |
   | 2022/0285356 A1* | 9/2022 | Son .................. H01L 21/02603 |

* cited by examiner

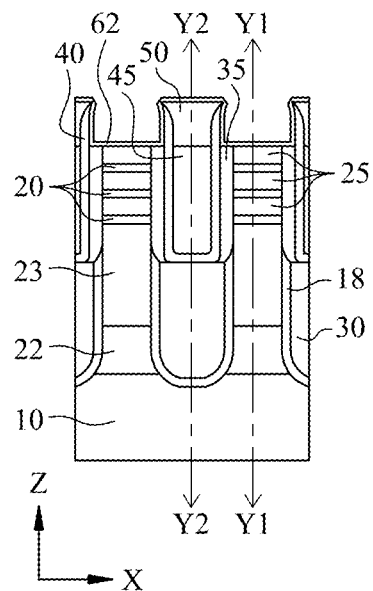
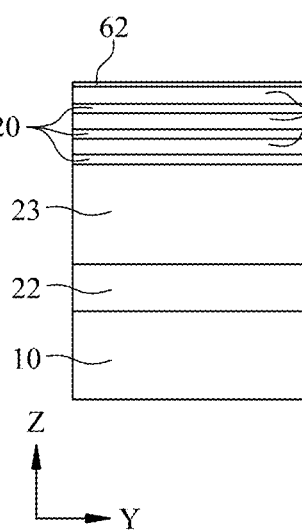
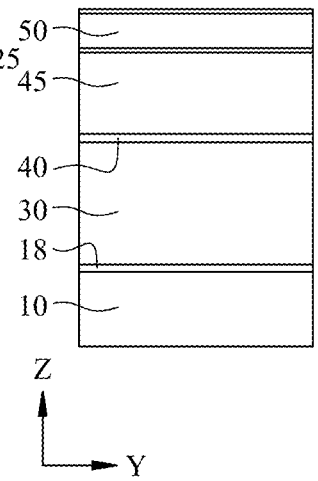
Fig. 10A    Fig. 10B    Fig. 10C
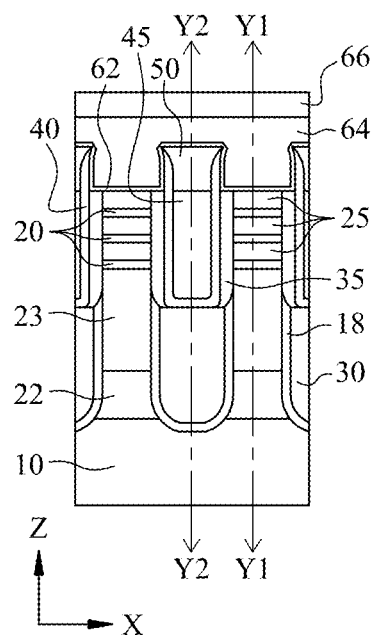
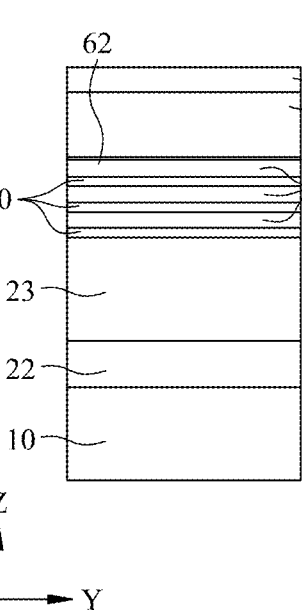
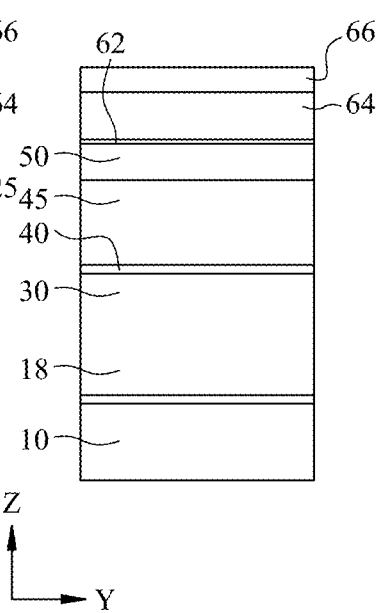
Fig. 11A    Fig. 11B    Fig. 11C

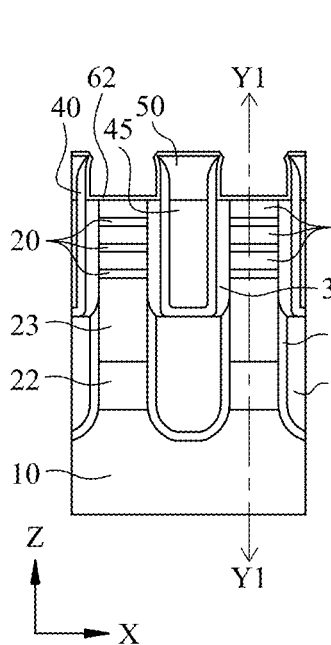 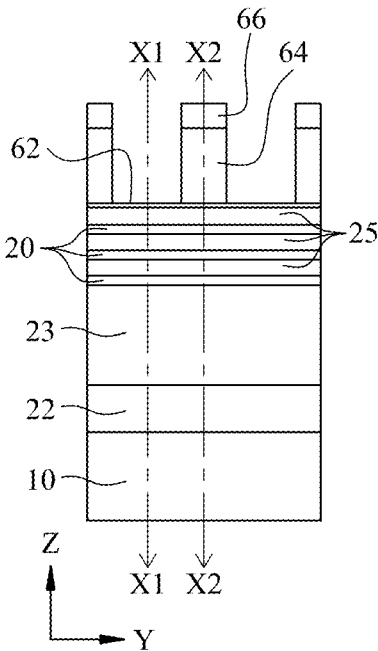 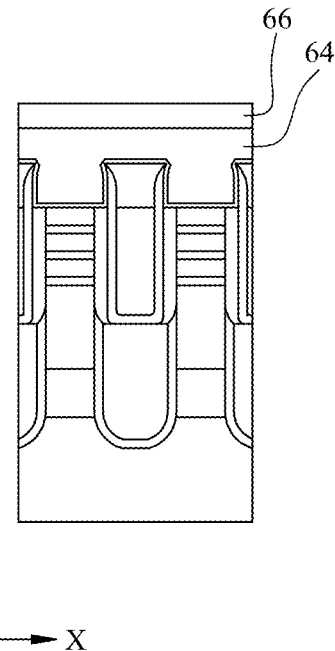
Fig. 12A     Fig. 12B     Fig. 12C
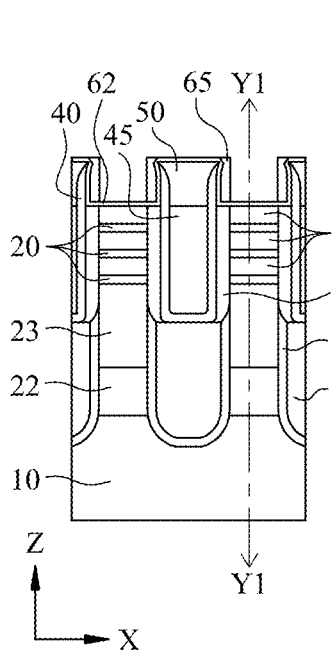 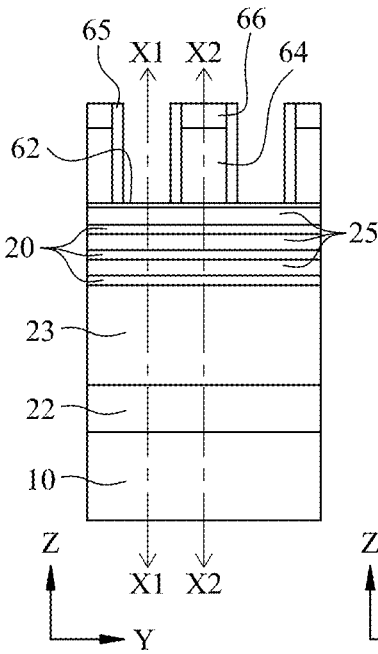 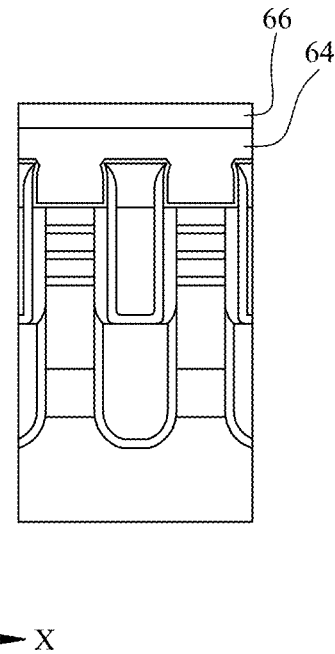
Fig. 13A     Fig. 13B     Fig. 13C

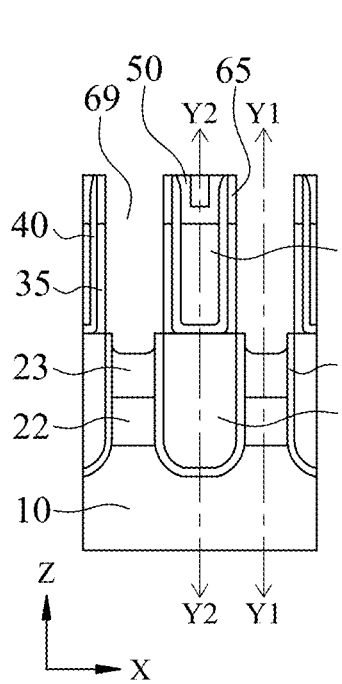 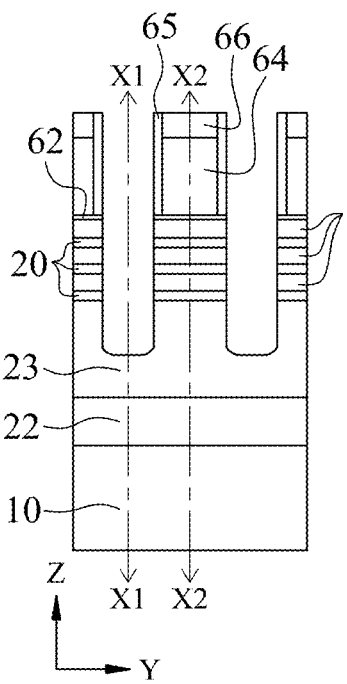 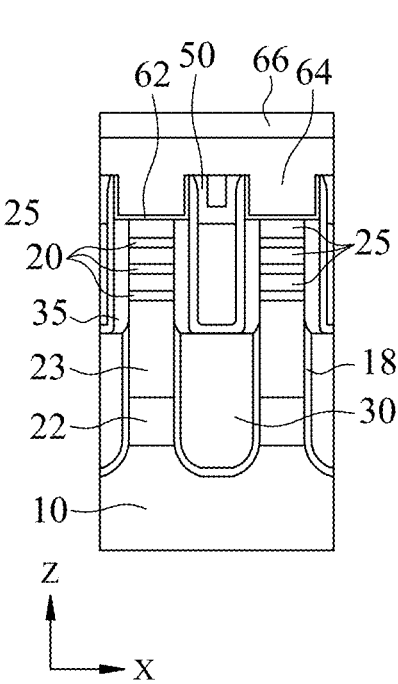
Fig. 17A  Fig. 17B  Fig. 17C
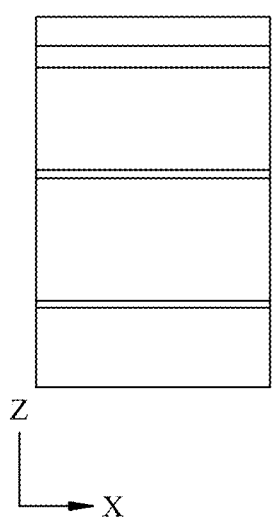
Fig. 17D

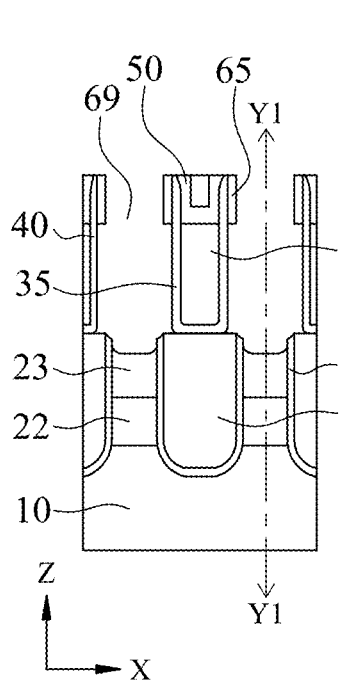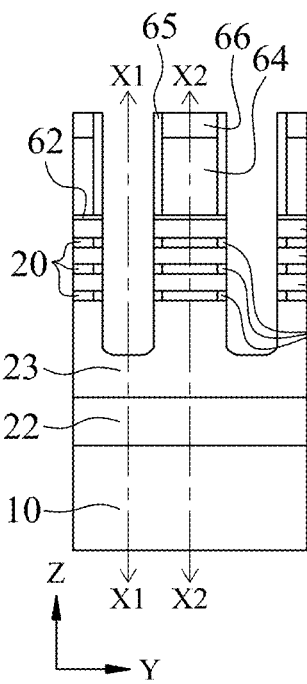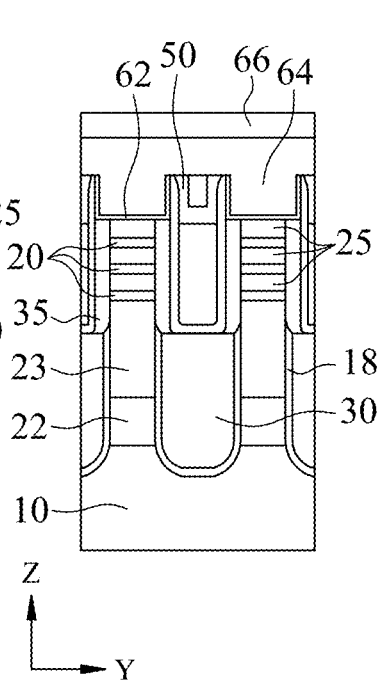
Fig. 18A  Fig. 18B  Fig. 18C
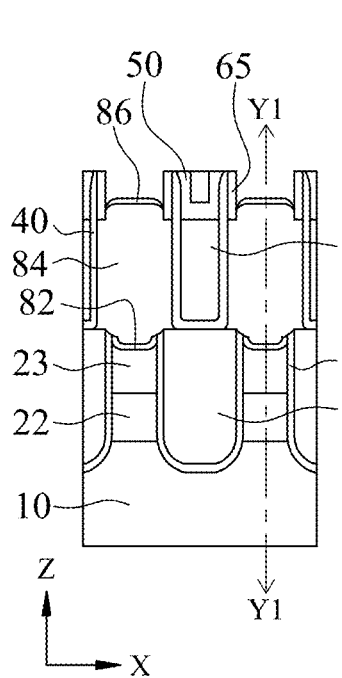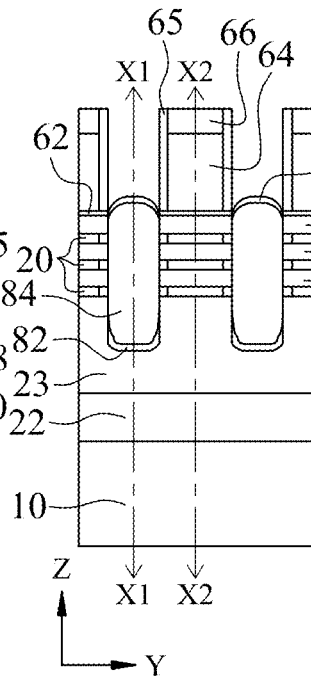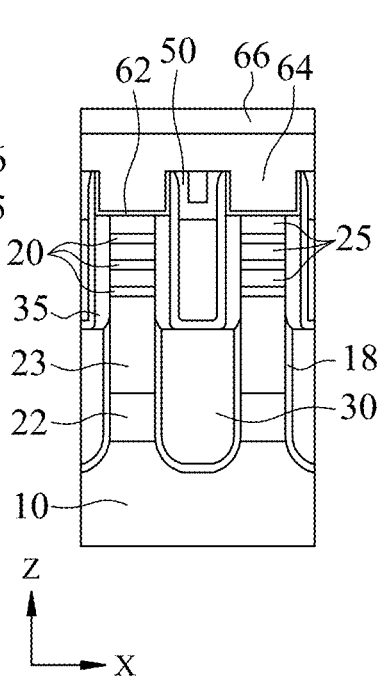
Fig. 19A  Fig. 19B  Fig. 19C

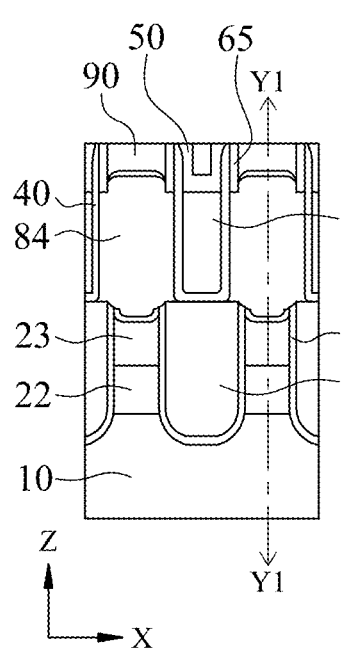
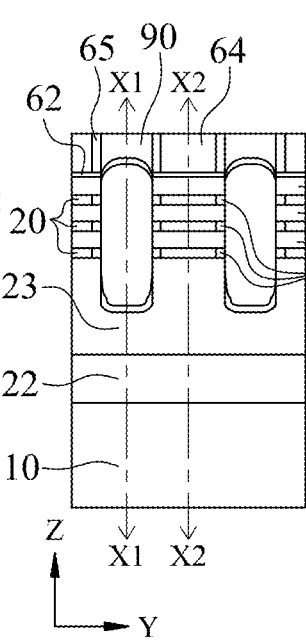
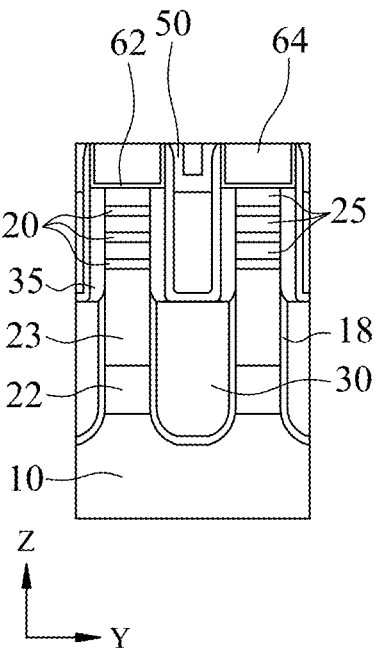
Fig. 20A    Fig. 20B    Fig. 20C
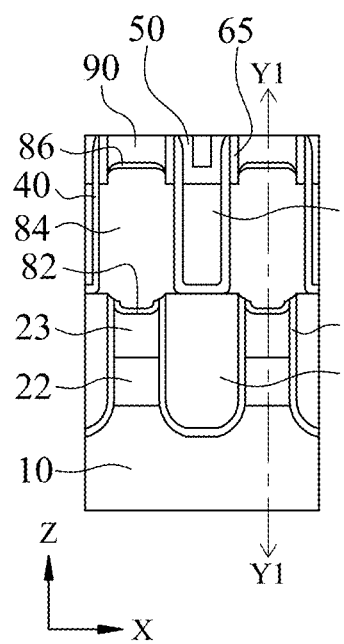
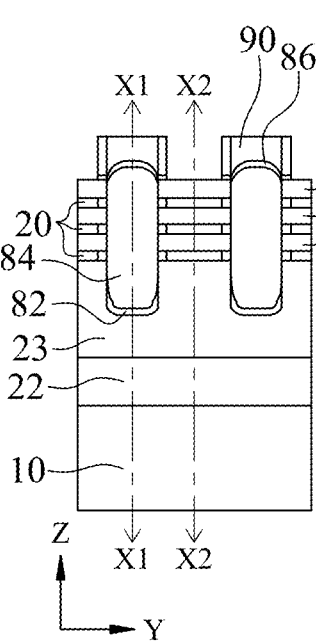
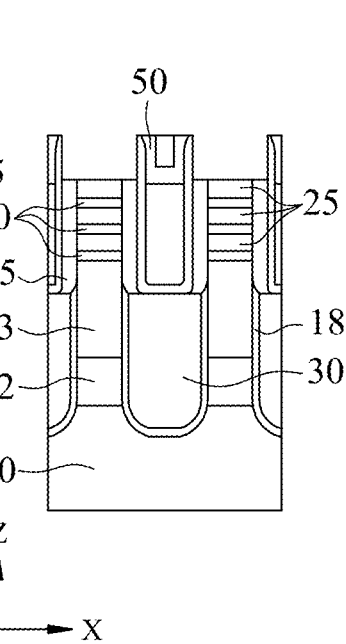
Fig. 21A    Fig. 21B    Fig. 21C

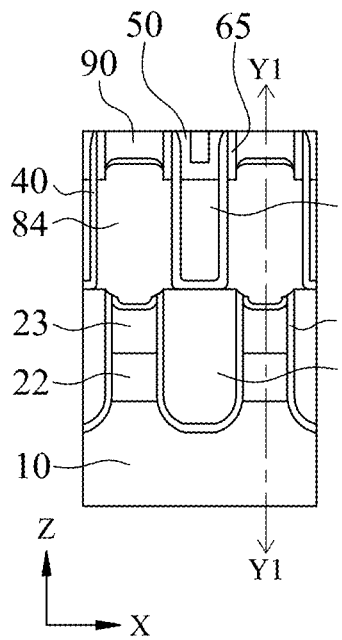 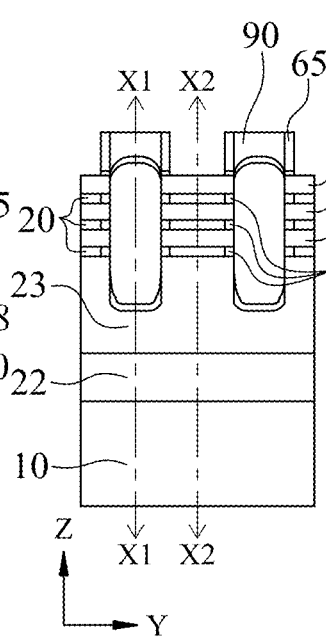 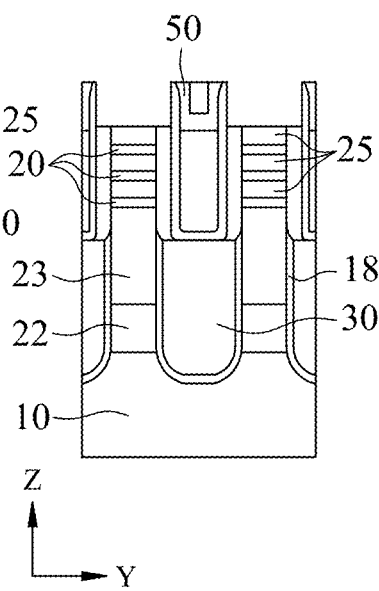
Fig. 22A  Fig. 22B  Fig. 22C
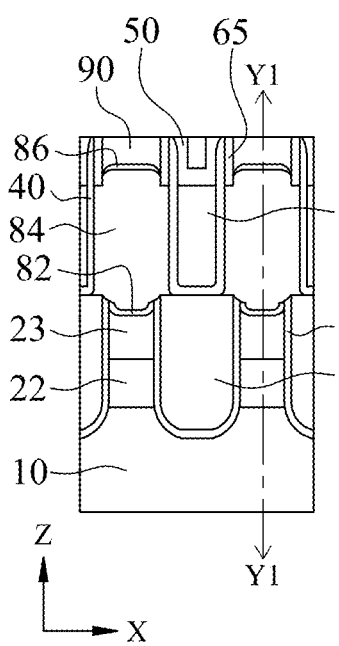 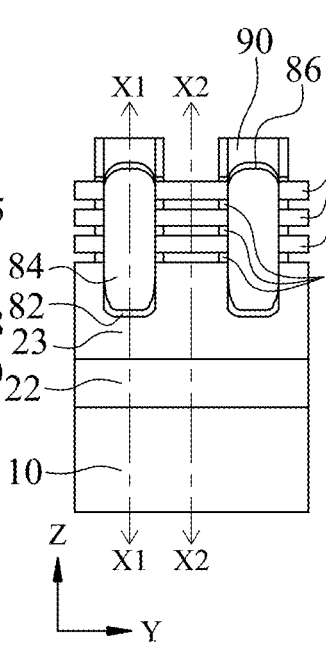 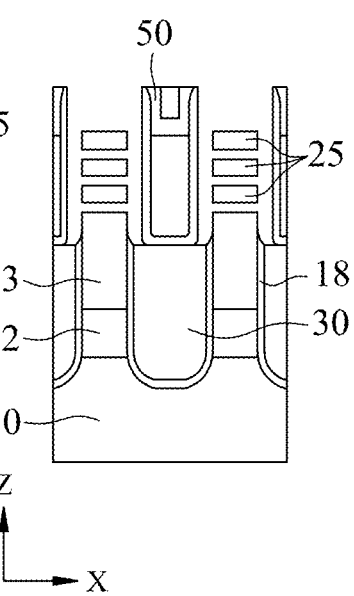
Fig. 23A  Fig. 23B  Fig. 23C

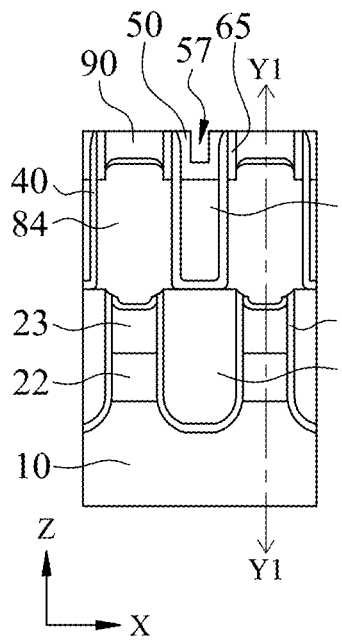 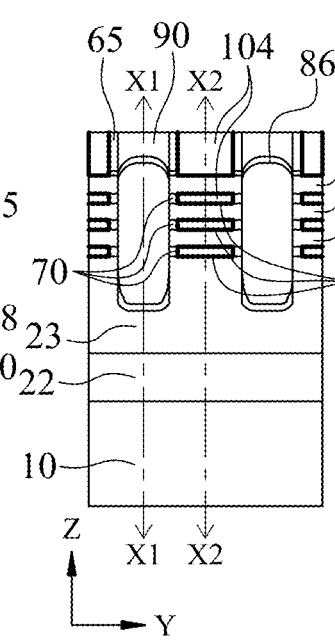 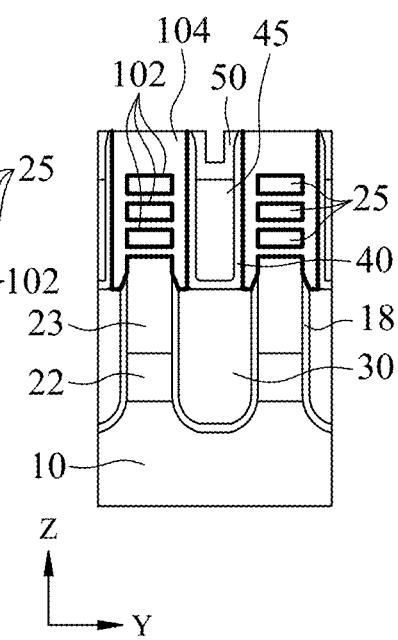
Fig. 24A    Fig. 24B    Fig. 24C
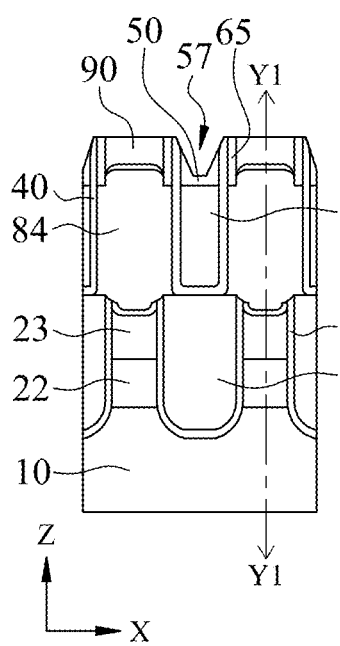 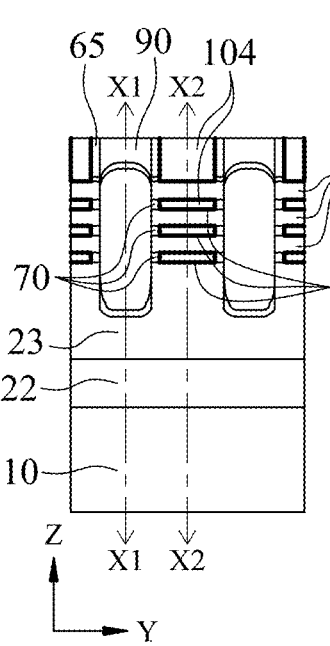 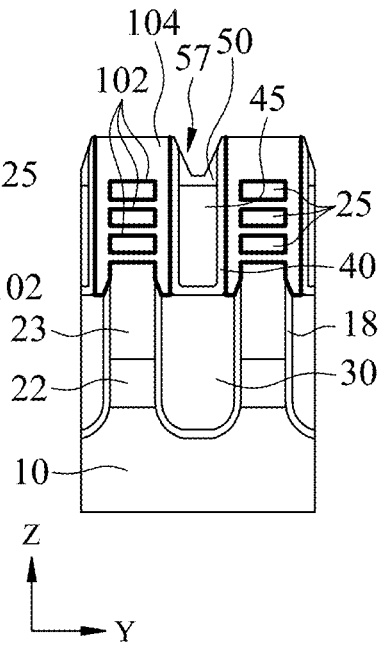
Fig. 25A    Fig. 25B    Fig. 25C

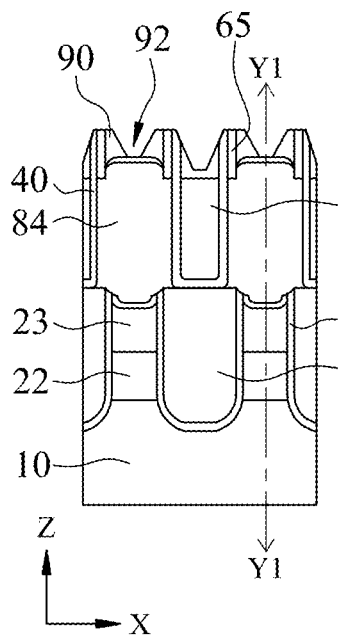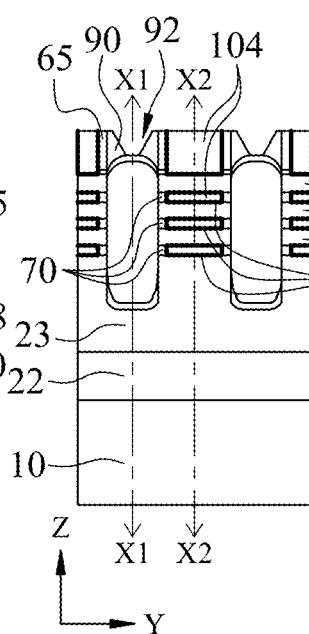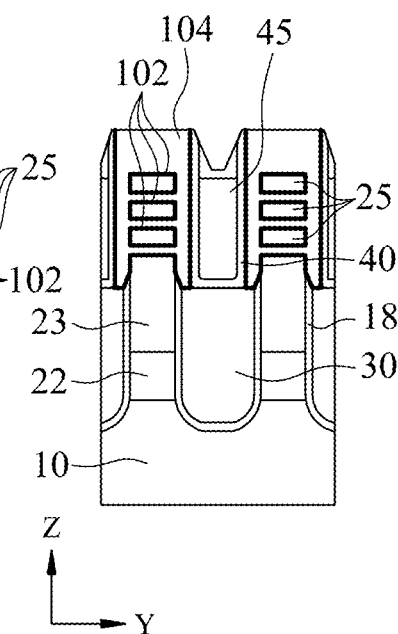
Fig. 26A    Fig. 26B    Fig. 26C
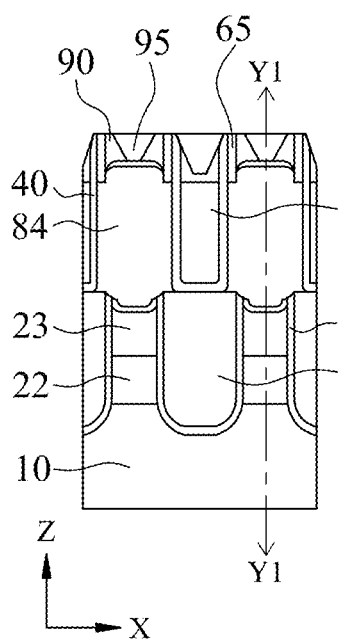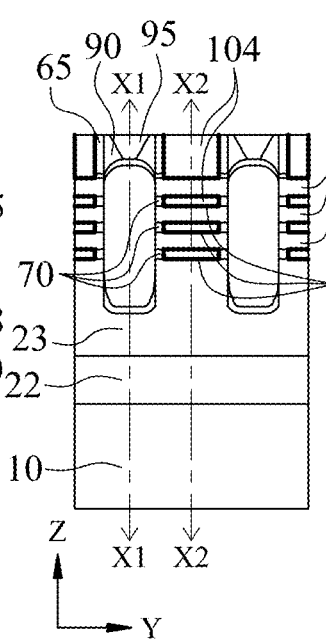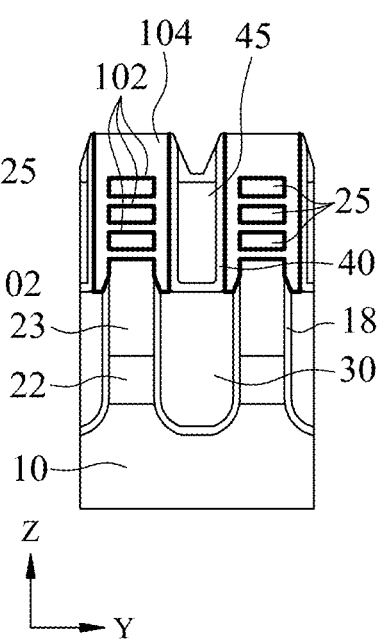
Fig. 27A    Fig. 27B    Fig. 27C

METHOD OF MANUFACTURING A SEMICONDUCTOR DEVICE AND A SEMICONDUCTOR DEVICE

RELATED APPLICATIONS

This application is a Divisional Application of U.S. application Ser. No. 17/575,145 filed on Jan. 13, 2022, which claims priority to U.S. Provisional Patent Application No. 63/225,128 filed Jul. 23, 2021, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 10A, 10B and 10C show various views of one of the various stages of manufacturing a semiconductor GAA FET device according to an embodiment of the present disclosure.

FIGS. 11A, 11B and 11C show various views of one of the various stages of manufacturing a semiconductor GAA FET device according to an embodiment of the present disclosure.

FIGS. 12A, 12B and 12C show various views of one of the various stages of manufacturing a semiconductor GAA FET device according to an embodiment of the present disclosure.

FIGS. 13A, 13B, 13C and 13D show various views of one of the various stages of manufacturing a semiconductor GAA FET device according to an embodiment of the present disclosure.

FIGS. 17A, 17B, 17C and 17D show various views of one of the various stages of manufacturing a semiconductor GAA FET device according to an embodiment of the present disclosure.

FIGS. 18A, 18B and 18C show various views of one of the various stages of manufacturing a semiconductor GAA FET device according to an embodiment of the present disclosure.

FIGS. 19A, 19B and 19C show various views of one of the various stages of manufacturing a semiconductor GAA FET device according to an embodiment of the present disclosure.

FIGS. 20A, 20B and 20C show various views of one of the various stages of manufacturing a semiconductor GAA FET device according to an embodiment of the present disclosure.

FIGS. 21A, 21B and 21C show various views of one of the various stages of manufacturing a semiconductor GAA FET device according to an embodiment of the present disclosure.

FIGS. 22A, 22B and 22C show various views of one of the various stages of manufacturing a semiconductor GAA FET device according to an embodiment of the present disclosure.

FIGS. 23A, 23B and 23C show various views of one of the various stages of manufacturing a semiconductor GAA FET device according to an embodiment of the present disclosure.

FIGS. 24A, 24B and 24C show various views of one of the various stages of manufacturing a semiconductor GAA FET device according to an embodiment of the present disclosure.

FIGS. 25A, 25B and 25C show various views of one of the various stages of manufacturing a semiconductor GAA FET device according to an embodiment of the present disclosure.

FIGS. 26A, 26B and 26C show various views of one of the various stages of manufacturing a semiconductor GAA FET device according to an embodiment of the present disclosure.

FIGS. 27A, 27B, 27C, 27D, 27E and 27F show various views of one of the various stages of manufacturing a semiconductor GAA FET device according to an embodiment of the present disclosure.

DETAILED DESCRIPTION

Figure 1:
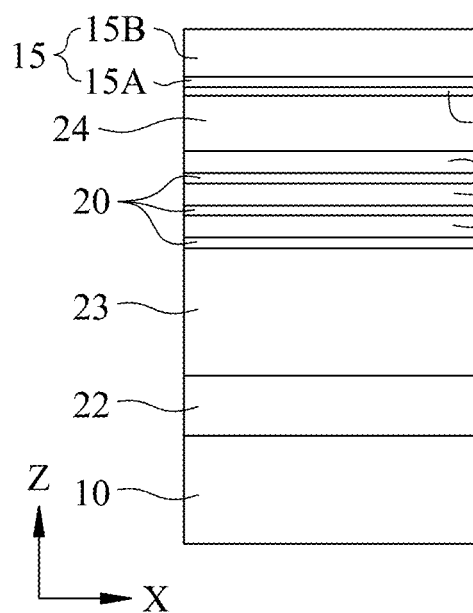
FIGS. 1, 2, 3, 4, 5, 6, 7 and 8 shows cross sectional views of various stages of manufacturing a semiconductor GAA FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

One of the factors to determine device performance of a field effect transistor (FET), such as a fin FET (FinFET) and a gate-all-around (GAA) FET, is a shape of an epitaxial source/drain structure. In particular, when a source/drain region of a FinFET or a GAA FET is recessed and then an epitaxial source/drain layer is formed therein, the etching substantially defines the shape of the epitaxial source/drain structure. Further, when two adjacent fin structures are close to each other, the epitaxial layers undesirably merge with each other. In the present disclosure, a wall fin structure (a dielectric dummy fin structure) is employed to physically and electrically separate adjacent source/drain epitaxial layers and to define the shape of the source/drain epitaxial layer. An optimal source/drain shape can improve a FinFET's and GAA FET's Ion/Ioff current ratio, and can improve device performance.

In this disclosure, a source/drain refers to a source and/or a drain. It is noted that in the present disclosure, a source and a drain are interchangeably used and the structures thereof are substantially the same.

FIGS. 1-27F show various stages of manufacturing a semiconductor GAA FET device according to an embodiment of the present disclosure. It is understood that additional operations can be provided before, during, and after processes shown by FIGS. 1-27F, and some of the operations described below can be replaced or eliminated, for additional embodiments of the method. The order of the operations/processes may be interchangeable.

As shown in FIG. 1, a first bottom semiconductor layer 22 is epitaxially formed on a semiconductor substrate 10. In some embodiments, the semiconductor substrate 10 is a crystalline Si substrate. In other embodiments, the substrate 10 includes another elementary semiconductor, such as germanium; a compound semiconductor including Group IV-IV compound semiconductors, such as SiC and SiGe, Group III-V compound semiconductors, such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate.

The first bottom semiconductor layer 22 is made of different material than the substrate 10. When the substrate 10 is a Si substrate, the first bottom semiconductor layer 22 includes SiGe, where a Ge content is about 10 atomic % to about 60 atomic % ($S_{0.9}Ge_{0.1}$—$S_{0.4}Ge_{0.6}$) in some embodiments. The thickness of the first bottom semiconductor layer 22 is in a range from about 4 nm to about 30 nm in some embodiments, and is in a range from about 5 nm to about 25 nm in other embodiments.

Further, a second bottom semiconductor layer 23 is epitaxially formed over the first bottom semiconductor layer 22. The second bottom semiconductor layer 23 is made of different material than the first bottom semiconductor layer 22. When the first bottom semiconductor layer 22 is made of SiGe, the second bottom semiconductor layer 23 includes Si or SiGe, where a Ge content is smaller than the first bottom semiconductor layer 23 and is more than 0 atomic % to about 10 atomic % in some embodiments. The thickness of the second bottom semiconductor layer 23 is in a range from about 40 nm to about 200 nm in some embodiments, and is in a range from about 50 nm to about 150 nm in other embodiments.

Then, first semiconductor layers 20 and second semiconductor layers 25 are alternately formed over the second bottom semiconductor layer 23. In some embodiments, the first and second bottom semiconductor layers are not formed, and the first semiconductor layers 20 and second semiconductor layers 25 are formed directly on the substrate 10.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is equal to or more than about 0.2 and equal to or less than about 0.6, and the second semiconductor layers 25 are Si or $Si_{1-y}Ge_y$, where y is smaller than x and equal to or less than about 0.1. In this disclosure, an "M" compound" or an "M based compound" means the majority of the compound is M.

The thickness of the first semiconductor layers 20 may be equal to or smaller than that of the second semiconductor layers 25, and is in a range from about 4 nm to about 30 nm in some embodiments, and is in a range from about 5 nm to about 20 nm in other embodiments. The thickness of the second semiconductor layers 25 is in a range from about 4 nm to about 30 nm in some embodiments, and is in a range from about 5 nm to about 20 nm in other embodiments. The thicknesses of the first semiconductor layers 20 may be the same as, or different from each other and the thicknesses of the second semiconductor layers 25 may be the same as, or different from each other. Although three first semiconductor layers 20 and three second semiconductor layers 25 are shown in FIG. 1, the numbers are not limited to three, and can be 1, 2 or more than 3, and less than 10.

Moreover, in some embodiments, a top semiconductor layer 24 is epitaxially formed over the stacked structure of the first semiconductor layers 20 and the second semiconductor layers 25. In some embodiments, the top semiconductor layer 24 is $Si_{1-z}Ge_z$, where z is equal to or more than about 0.2 and equal to or less than about 0.7. In some embodiments, z=x. The thickness of the top semiconductor layer 24 is greater than that of each of the first semiconductor layers 20 and the second semiconductor layers 25. In some embodiments, the thickness of the top semiconductor layer 24 is in a range from about 10 nm to about 100 nm, and is in a range from about 20 nm to about 50 nm in other embodiments. Further, in some embodiments, a cap semiconductor layer 26 made of a different material than the top semiconductor layer 24 is epitaxially formed on the top semiconductor layer 24. In some embodiments, the cap semiconductor layer is made of Si and has a thickness in a range from about 0.5 nm to about 10 nm. The cap semiconductor layer 26 is used to control Ge out-diffusion from the top semiconductor layer 24, and to maintain the quality of the surface of the top semiconductor layer 24 during a subsequently performed chemical mechanical polishing (CMP) process.

Further, a hard mask layer 15 including one or more layers of an insulating material or an amorphous semiconductor material (e.g., a-Si) is formed over the cap semiconductor layer 26. In some embodiments, the hard mask layer 15 includes a first hard mask layer 15A and a second hard mask layer 15B. In some embodiments, the first hard mask layer 15A is silicon oxide having a thickness in a range from 1 nm to about 20 nm and the second hard mask layer 15B is silicon nitride having a thickness in a range from about 10 nm to about 100 nm.

Figure 2:
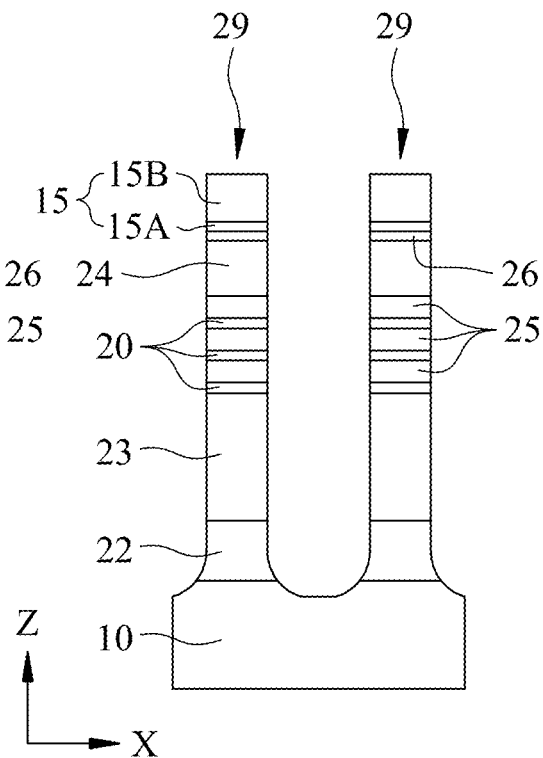

After the stacked layers as shown in FIG. 1 are formed, fin structures are formed by using one or more lithography and etching operations, as shown in FIG. 2. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the hard mask layer 15. By using the patterned hard mask layer as an etching mask, the stacked semiconductor layers are patterned into fin structures 29 as shown in FIG. 2. In some embodiments, the top semiconductor layer 24 and the cap semiconductor layer 26 are part of the hard mask layer and an etch stop layer for a subsequently performed CMP process.

In FIG. 2, the fin structures 29 extend in the Y direction and are arranged in the X direction. The number of the fin structures is not limited to two as shown in FIG. 2, and may be as small as one and three or more. In some embodiments, one or more dummy fin structures are formed on both sides of the fin structures 29 to improve pattern fidelity in the patterning operations.

The width of the upper portion of the fin structure 29 along the Y direction is in a range from about 5 nm to about 40 nm in some embodiments, and is in a range from about 10 nm to about 30 nm in other embodiments.

After the fin structures 29 are formed, one or more liner insulating layers 18 are formed over the fin structures 29, and an insulating material layer 30 including one or more layers of insulating material is formed over the substrate so that the fin structures 29 with the liner layer 18 are fully embedded in the insulating layer 30.

Figure 3:
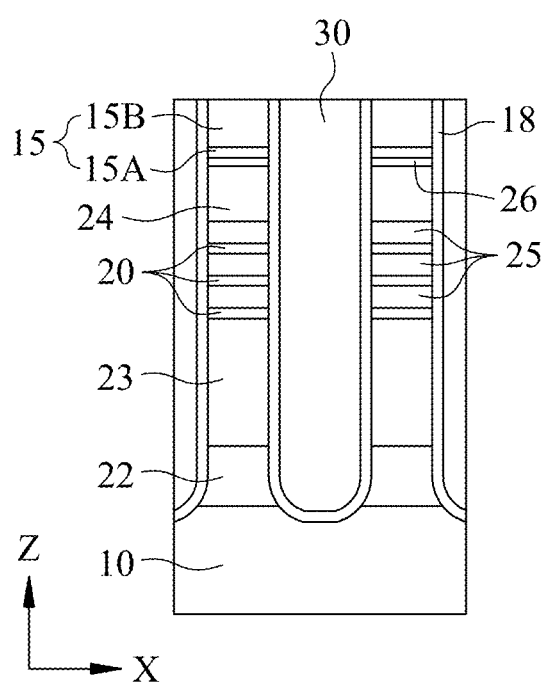

The insulating material for the liner layer 18 and the insulating layer 30 are the same or different from each other, and include one or more of silicon oxide, silicon nitride, silicon oxynitride (SiON), SiOCN, SiOC, SiCN, fluorine-doped silicate glass (FSG), or a low-k dielectric material. In some embodiments, the liner layer 18 is made of silicon oxide or silicon nitride, and the insulating layer 30 is made of silicon oxide. The insulating material is formed by LPCVD (low pressure chemical vapor deposition), plasma-enhanced CVD (PECVD), flowable CVD and/or atomic layer deposition (ALD). An anneal operation may be performed after the formation of the insulating layer 30. Then, a planarization operation, such as a chemical mechanical polishing (CMP) method and/or an etch-back method, is performed such that the upper surface of the hard mask layer 15 (the second hard mask layer 15B) is exposed from the insulating material layer 30, as shown in FIG. 3.

Figure 4:
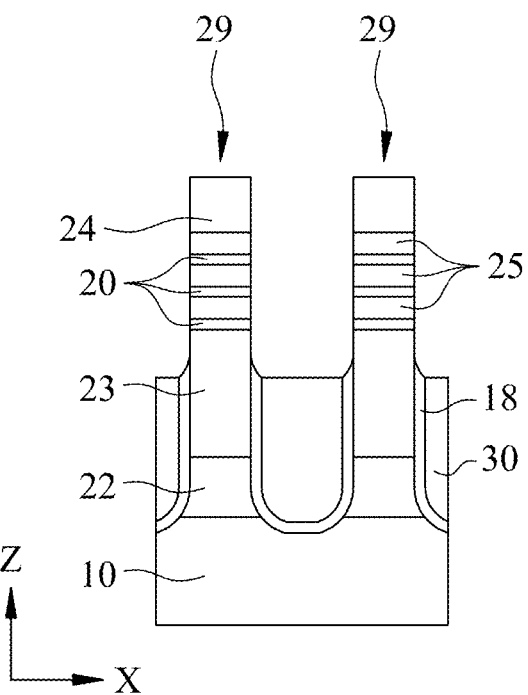

Then, as shown in FIG. 4, the insulating material layer is recessed to form an isolation insulating layer 30 so that the upper portions of the fin structures 29 are exposed. With this operation, the fin structures 29 are separated from each other by the isolation insulating layer 30, which is also called a shallow trench isolation (STI).

In some embodiments, the insulating material layer 30 is recessed until the upper portion of the second bottom semiconductor layer 23 is exposed. The first semiconductor layers 20 are sacrificial layers which are subsequently removed, and the second semiconductor layers 25 are subsequently formed into semiconductor wires or sheets as channel layers of a GAA FET. In some embodiments, during or after the recess etching of the insulating layer 30, the liner layer 18, the hard mask layer 15 and the cap semiconductor layer 26 are removed, thereby exposing the top semiconductor layer 24, as shown in FIG. 4.

Figure 5:
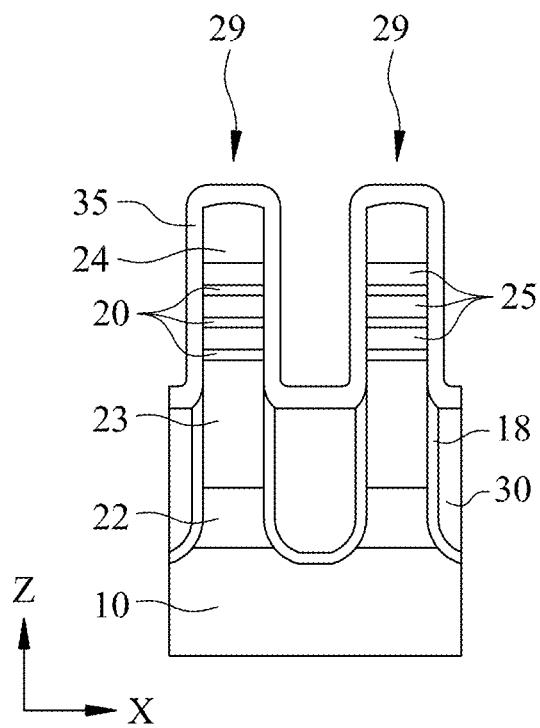

After the isolation insulating layer 30 is formed, a sacrificial cladding layer 35 is formed over the exposed portion of the fin structures 29, as shown in FIG. 5. The sacrificial cladding layer 35 includes one or more insulating materials or semiconductor materials. In some embodiments, the sacrificial cladding layer 35 includes amorphous or poly crystalline semiconductor material (e.g., Si, SiC, SiGe or Ge). In certain embodiments, the sacrificial cladding layer 35 is amorphous SiGe, having a Ge concentration in a range from about 20 atomic % to about 40 atomic %. In some embodiments, the Ge concentration of the sacrificial cladding layer 35 is the same as or similar to (difference within ±5%) the Ge concentration of the first semiconductor layer 20. In some embodiments, the thickness of the sacrificial cladding layer 35 is in a range from about 5 nm to about 50 nm. If the thickness of the sacrificial cladding layer 25 is smaller than this range, a space for a metal gate formation is too small and some of the layers of the metal gate structure would not be properly formed. If the thickness of the sacrificial cladding layer 25 is larger than this range, electrical separation between adjacent fin structures would be insufficient. In some embodiments, before forming the sacrificial cladding layer 35, a thin semiconductor layer is formed over the exposed portion of the fin structures 29. In some embodiments, the thin semiconductor layer is non-doped Si. In some embodiments, the non-doped Si is crystalline Si. In some embodiments, the thickness of the thin semiconductor layer is in a range from about 2 nm to about 3 nm. The sacrificial cladding layer 35 is conformally formed by CVD or ALD in some embodiments. The deposition temperature of the sacrificial cladding layer 35 is less than or similar to the deposition temperature of the first semiconductor layers 20, in some embodiments. In some embodiments, the deposition temperature of the sacrificial cladding layer 35 is in a range from about 500° C. to 650° C. The source gas includes a mixture of $SiH_4$, $GeH_4$, and HCl with $H_2$ or $N_2$ as a carrier gas. The sacrificial cladding layer 35 controls stress in the isolation area.

Figure 6:
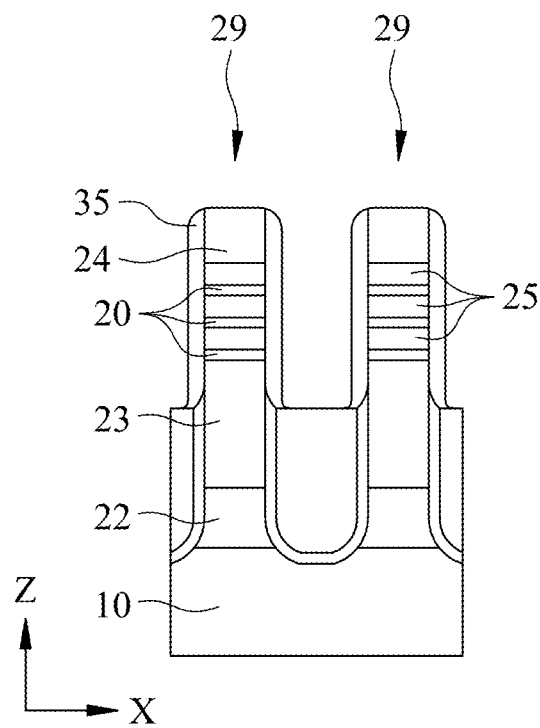

Then, as shown in FIG. 6, one or more etch-back operations are performed to remove horizontal portions of the sacrificial cladding layer 35 to expose the upper surface of the top semiconductor layer 24 and the upper surface of the isolation insulating layer 30. In some embodiments, the etch-back operation includes a deposition-etching process. In some embodiments, the plasma generated from $CH_4$ is used for the deposition phase, and the plasma generated from HBr and He is used for the etching phase, which are repeated. In some embodiments, after the deposition-etching operation, a wet cleaning process to remove residuals is performed.

Figure 7:
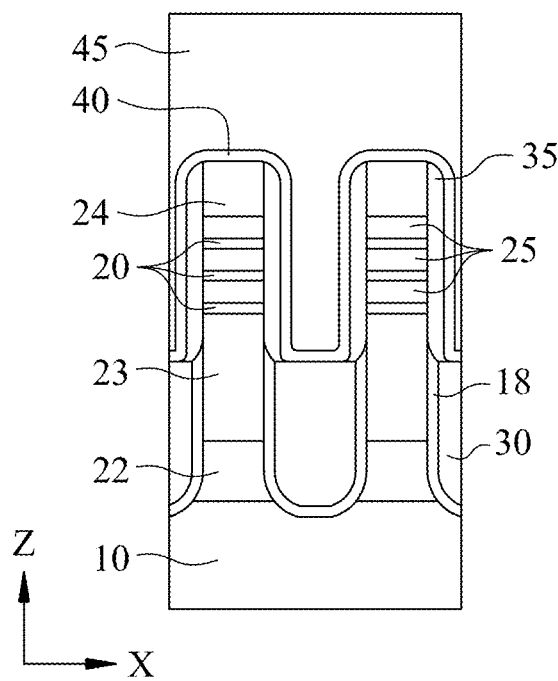

Subsequently, a first dielectric layer 40 is formed over the fin structures, and a second dielectric layer 45 is formed over the first dielectric layer 40 such that the fin structures are fully embedded in the second dielectric layer 45, as shown in FIG. 7. The first dielectric layer 40 includes one or more layers of insulating materials such as silicon oxide, silicon oxynitride, silicon nitride, SiOC, SiCN or SiOCN, formed by LPCVD (low pressure chemical vapor deposition), plasma-CVD or atomic layer deposition (ALD), or any other suitable film formation method. In certain embodiments, SiCN or SiOCN is used as the first dielectric layer 40. In some embodiments, as shown in FIG. 7, the first dielectric layer 40 is conformally formed over the fin structures such that a space is formed between adjacent fin structures. The thickness of the first dielectric layer 40 is in a range of about 2.5 nm to about 20 nm in some embodiments, and is in a range from about 5 nm to about 10 nm in other embodiments.

The material of the second dielectric layer 45 is different from the material of the first dielectric layer 40. In some embodiments, the second dielectric layer 45 includes one or more layers of insulating materials such as silicon oxide, silicon oxynitride, silicon nitride, SiOC, SiCN or SiOCN formed by LPCVD, plasma-CVD or ALD, or any other suitable film formation method. In some embodiments, the second dielectric layer 45 is made of silicon nitride or silicon oxide. In some embodiments, the second dielectric layer 45 includes a first layer and a second layer. The first layer is silicon oxide formed by, for example, a flowable CVD process followed by a thermal annealing process at 400° C. to 800° C. in an inert gas ambient. The second layer is also silicon oxide formed by a plasma CVD process. The thickness of the second dielectric layer 45 is in a range of about 60 nm to about 500 nm in some embodiments. As shown in FIG. 7, the second dielectric layer 45 fully fills the space between adjacent fin structures, in some embodiments. In other embodiments, a void is formed in the bottom part of the space. In some embodiments, one or more additional dielectric layers are formed between the first dielectric layer 40 and the second dielectric layer 45.

Figure 8:
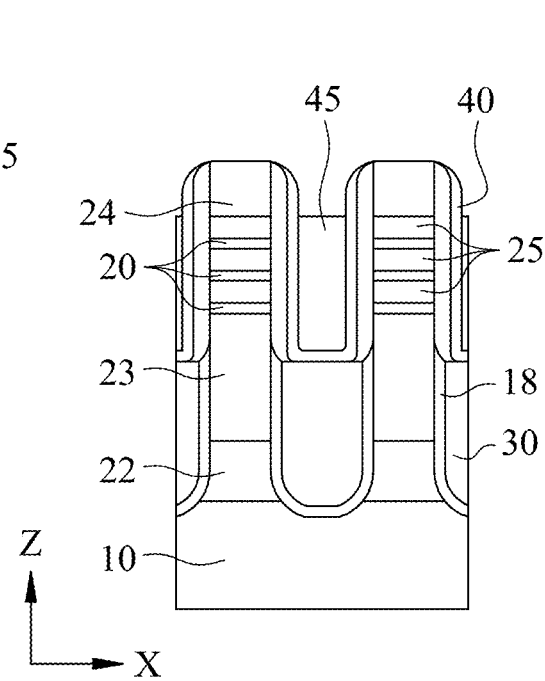

After the second dielectric layer 45 is formed, a planarization operation, such as an etch-back process or a chemical mechanical polishing (CMP) process, is performed to planarize the second dielectric layer 45 and to expose the upper surface of the top semiconductor layer 24. In some embodiments, the top semiconductor layer 24 is slightly etched by about 5 nm to about 10 nm. Further, one or more additional etch-back operations are performed to recess the second dielectric layer 45 as shown in FIG. 8. The second dielectric layer 45 is recessed to a level substantially equal (within ±5 nm) to the interface between the top semiconductor layer 24 and the uppermost one of the second semiconductor layers 25. In some embodiments, subsequently, the first dielectric layer 40 is further trimmed (etched) to expose a part of the sacrificial cladding layer 35.

Figure 9A:
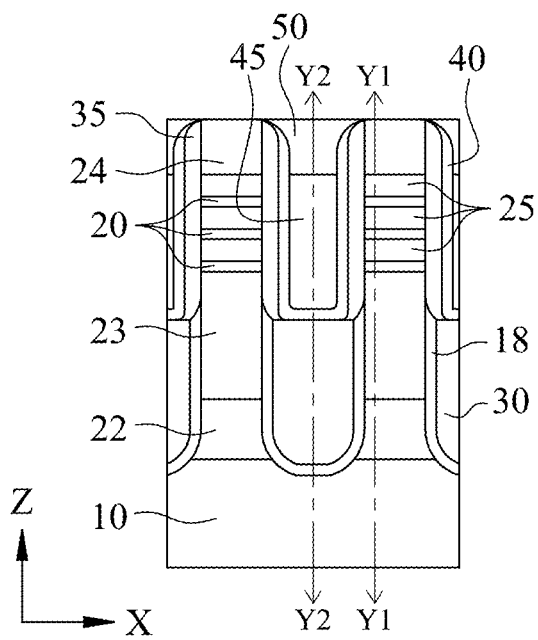
FIGS. 9A, 9B, 9C and 9D show various views of one of the various stages of manufacturing a semiconductor GAA FET device according to an embodiment of the present disclosure.
Figure 9B:
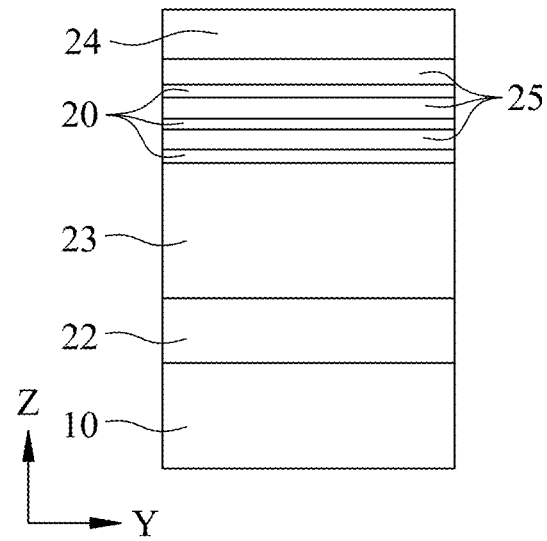
Figure 9C:
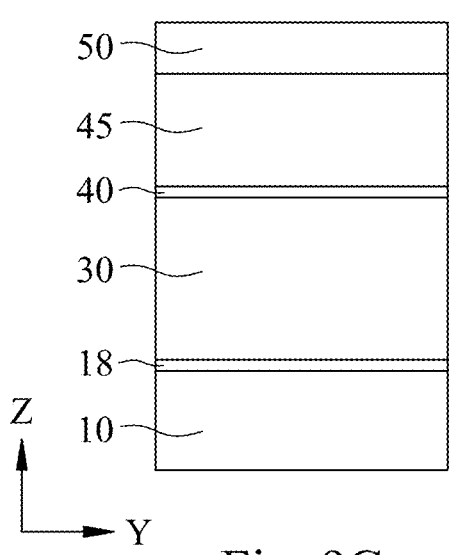
Figure 9D:
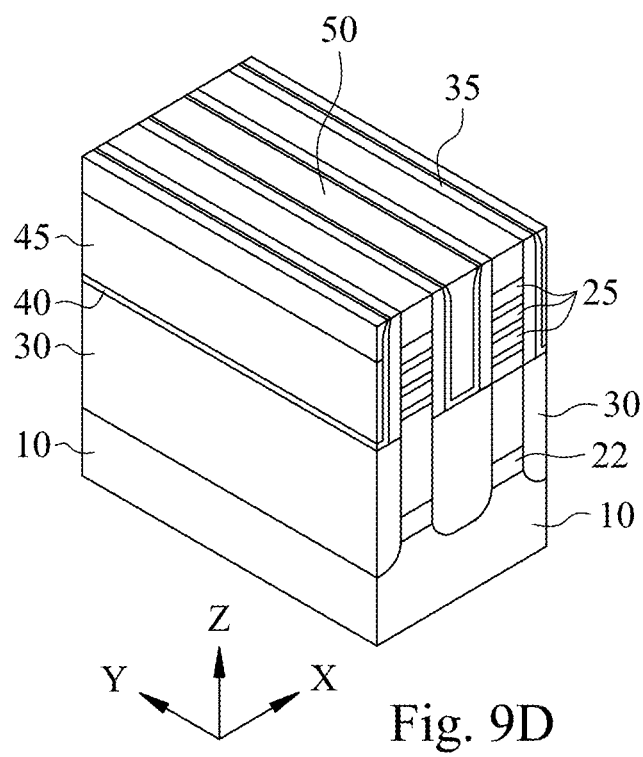

Next, as shown in FIGS. 9A-9D, a third dielectric layer 50 is formed on the recessed second dielectric layer 45. FIG. 9A is a cross sectional view along the X direction, FIG. 9B is a cross sectional view along the Y direction corresponding to line Y1-Y1 of FIG. 9A, FIG. 9C is a cross sectional view along the Y direction corresponding to line Y2-Y2 of FIG. 9A, and FIG. 9D is an isometric view.

The material of the third dielectric layer 50 is different from the materials of the first dielectric layer 40 and the second dielectric layer 45. In some embodiments, the third dielectric layer 45 includes a material having a lower etching rate than the second dielectric layer against a polysilicon or an amorphous SiGe etching. In some embodiments, the third dielectric layer 50 includes a high-k dielectric material. In some embodiments, the third dielectric layer 50 includes a dielectric material having a higher dielectric constant (k) than the second dielectric layer 45 and/or the first dielectric layer 40.

In some embodiments, the third dielectric layer 50 includes one or more of non-doped hafnium oxide (e.g., $HfO_x$, $0<x\leq2$), hafnium oxide doped with one or more other elements (e.g., HfSiO, HfSiON, HfTaO, HfTiO or HfZrO), zirconium oxide, aluminum oxide, titanium oxide, and a hafnium dioxide-alumina ($HfO_2$—$Al_2O_3$) alloy. In certain embodiments, hafnium oxide ($HfO_x$) is used as the third dielectric layer 50. The third dielectric layer 50 can be formed by LPCVD, plasma-CVD or ALD, or any other suitable film formation method. As shown in FIG. 9A, the third dielectric layer 50 fully fills the space between adjacent fin structures. After the third dielectric layer 50 is formed to fully cover the fin structures, a planarization operation, such as an etch-back process or a CMP process, is performed to planarize the upper surface of the third dielectric layer 40 to expose the upper surface of the top semiconductor layer 24, as shown in FIGS. 9A-9D. In some embodiments, the thickness of the third dielectric layer 50 remaining on the top semiconductor layer 24 is in a range from about 5 nm to about 100 nm, the width of the third dielectric layer 50 at the top thereof is in a range from about 10 nm to about 80 nm, depending on device and/or process requirements. Accordingly, a wall fin structure (a dummy fin structure) is formed by layers 40, 45 and 50 between adjacent fin structures. After the wall fin structure is formed, an annealing operation at a temperature of about 800° C. to about 1000° C. is performed for about 10 sec to about 60 sec, in some embodiments.

Then, as shown in FIGS. 10A-10C, the top semiconductor layer 24 is removed by one or more dry or wet etching operations. In FIGS. 10A-10C to 21A-21C, the "B" figures are cross sectional views along the Y direction corresponding to line Y1-Y1 of the "A" figures, and the "C" figures are cross sectional view along the Y direction corresponding to line Y2-Y2 of the "A" figures. As shown in FIG. 10A, a groove having sidewalls formed by the cladding layers 35 is formed. After the top semiconductor layer 24 is removed, a sacrificial gate dielectric layer 62 is formed on the uppermost one of the second semiconductor layers 25, the sidewalls of the first dielectric layer, and on the third dielectric layer 50 as shown in FIGS. 10A-10C. The sacrificial gate dielectric layer 62 includes one or more layers of insulating material, such as a silicon oxide-based material. In one embodiment, silicon oxide formed by CVD is used. The thickness of the sacrificial gate dielectric layer 62 is in a range from about 1 nm to about 5 nm in some embodiments.

Further, as shown in FIGS. 11A-11C, a sacrificial (dummy) gate electrode layer 64 is formed, and a hard mask layer 66 is formed on the sacrificial gate electrode layer 64. The sacrificial gate electrode layer 64 is blanket deposited on the sacrificial gate dielectric layer 62 and over the third dielectric layer 50, such that the third dielectric layer 50 is fully embedded in the sacrificial gate electrode layer 64. The sacrificial gate electrode layer 64 includes silicon, such as polycrystalline silicon or amorphous silicon. The thickness of the sacrificial gate electrode layer 64 is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, the hard mask layer 66 is formed over the sacrificial gate electrode layer. The hard mask layer 66 includes one or more layers of silicon nitride layer or silicon oxide.

Next, a patterning operation is performed on the hard mask layer 66 and the sacrificial gate electrode layer 64 is patterned into sacrificial gate electrodes, as shown in FIGS. 12A-12C. In some embodiments, the width of the sacrificial gate electrode 64 is in a range from about 5 nm to about 30 nm and is in a range from about 10 nm to about 20 nm. Two or more sacrificial gate electrodes are arranged in the Y direction in some embodiments. In certain embodiments, one or more dummy sacrificial gate electrodes are formed on both sides of the sacrificial gate electrodes to improve pattern fidelity.

Figure 13D:
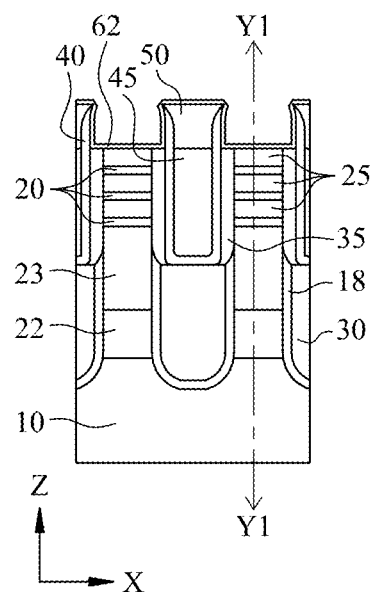

Further, sidewall spacers 65 are formed over the sacrificial gate electrodes 64, as shown in FIGS. 13A-13C. One or more insulating layers are deposited in a conformal manner to have substantially equal thicknesses on vertical surfaces, such as the sidewalls, horizontal surfaces, and the top of the sacrificial gate electrode and the sidewalls by the first dielectric layer 40, respectively. Then, by using anisotropic etching, the sidewall spacers 65 are formed. In some embodiments, the sidewall spacer has a thickness in a range from about 3 nm to about 20 nm. The sidewall spacers 65 include one or more of silicon nitride, SiON, SiCN, SiCO, SiOCN or any other suitable dielectric material. In some embodiments, since the height of the third dielectric layer 50 is much smaller than the height of the sacrificial gate electrode layer 64 with the hard mask layer, the thickness of the sidewall spacers on sidewalls of the first dielectric layer which is on the third dielectric layer 50 is smaller than the thickness of the sidewall spacers on the sacrificial gate electrode 64, or no sidewall spacer is formed on sidewalls of the first dielectric layer which is on the third dielectric layer 50 as shown in FIG. 13D.

Figure 14:
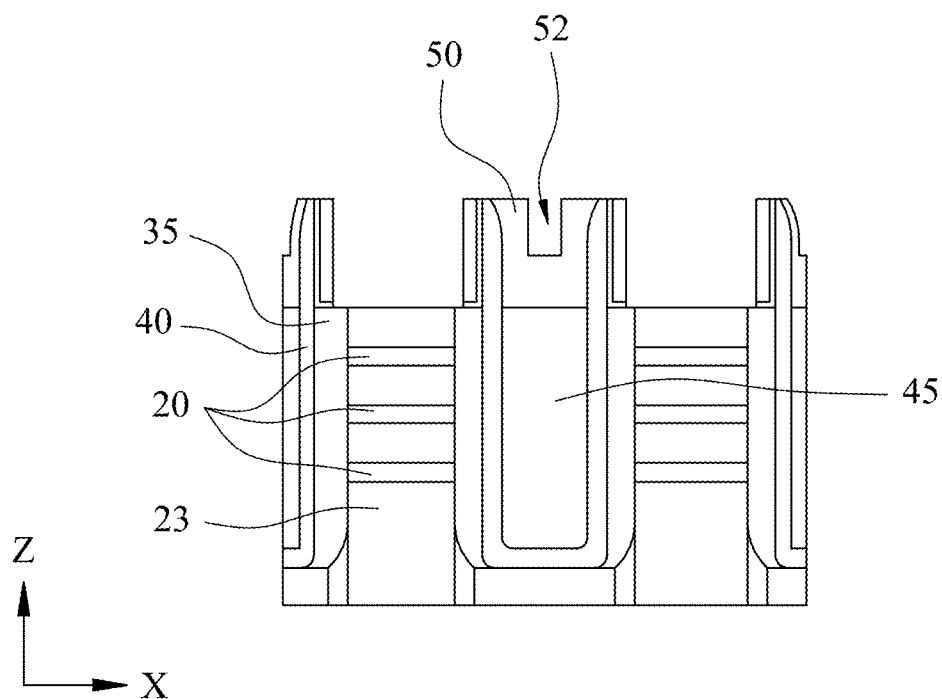
FIGS. 14, 15, and 16 show cross sectional views of the various stages of manufacturing a semiconductor GAA FET device according to an embodiment of the present disclosure.
Figure 15:
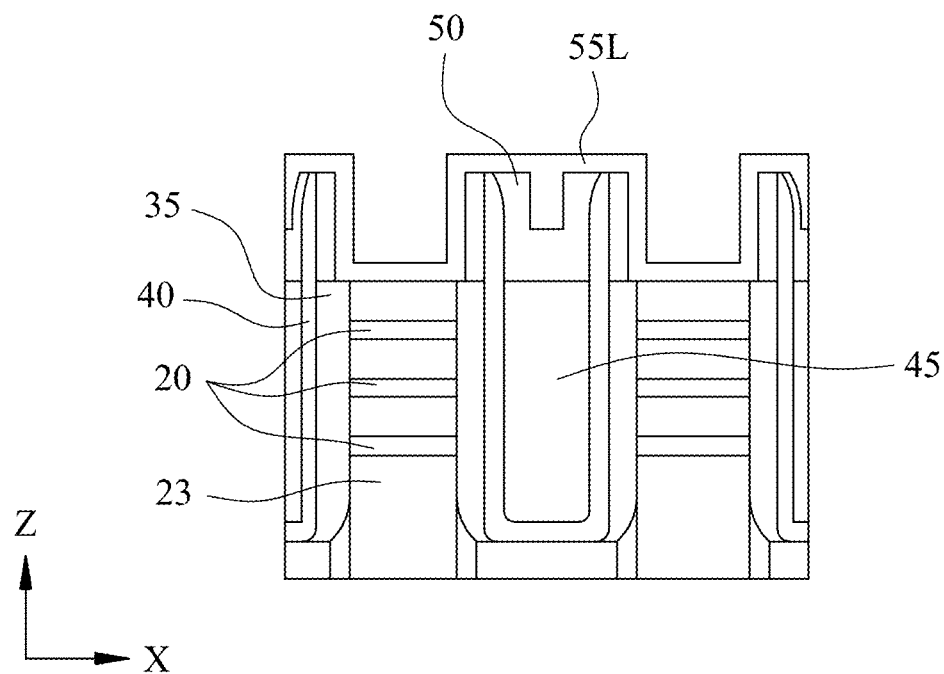
Figure 16:
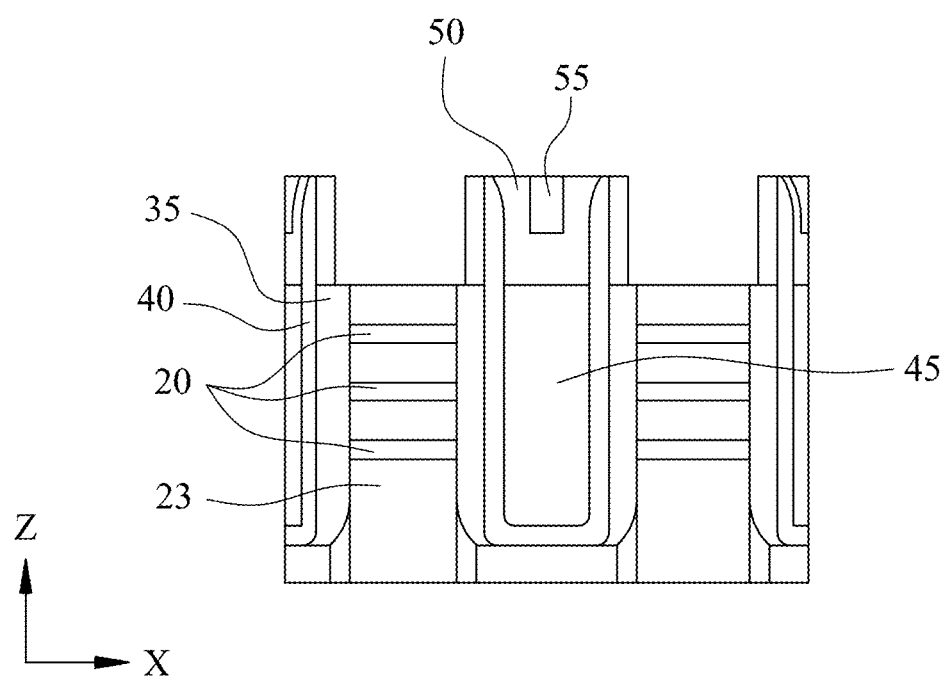

FIGS. 14-16 show enlarged cross sectional views along the X direction showing an upper portion of the wall (dummy) fin structure.

In some embodiments, a part of the third dielectric layer 50 is recessed to form a groove 52 by using or more lithography and etching operations, as shown in FIG. 14. In some embodiments, the groove 52 has a V-shape or a reverse trapezoid (not rectangular) shape along the X direction. Accordingly, the third dielectric layer 50 has a V-shape cross section in the X direction in some embodiments.

In some embodiments, the etching operation includes a plasma etching operation using a source gas including carbon and fluorine atoms. In some embodiments, the source gas is a mixture of $C_4F_6$ and $CHF_3$. Due to etching by-products (e.g., polymer), the cross section of the groove 52 has a rectangular shape, V-shape or a reverse trapezoid shape having a top wider than a bottom.

Then, as shown in FIG. 15, a blanket layer 55L for a fourth dielectric layer is conformally formed in the groove 52 and on the third dielectric layer and on the uppermost second semiconductor layers 25. The dielectric layer 55L is made of a different material than the third dielectric layer 50, and includes one of silicon nitride, silicon oxide, SiON, SiOC, SiCN or SiOCN, or any other suitable dielectric material. In some embodiments, the dielectric layer 55L is made of SiCN. The fourth dielectric layer can be formed by ALD or any other suitable methods.

Then, as shown in FIG. 16, one or more etching operations are performed to remove part of the dielectric layer 55L leaving a fourth dielectric layer 55 in the groove 52. In some embodiments, the etching operation includes a plasma etching operation using a source gas including carbon and fluorine atoms. In some embodiments, the source gas includes $CH_3F$.

Then, the stacked structure of the first semiconductor layers 20 and the second semiconductor layer 25 is etched down at the source/drain regions, by using one or more etching operations, thereby forming a source/drain space 69, as shown in FIGS. 17A-17D. FIG. 17D shows a cross section corresponding to line Y2-Y2 of FIG. 17A. In some embodiments, the second bottom semiconductor layer 23 is also partially etched. In some embodiments, during the etching, the sacrificial cladding layer 35 is partially or fully removed. In some embodiments, when no or thin sidewall spacer is formed on sidewalls of the first dielectric layer which is on the third dielectric layer 50, the sacrificial cladding layer 35 is also removed during the etching to form the source/drain space 69.

Further, inner spacers are formed a shown in FIGS. 18A-18C. The first semiconductor layers 20 are laterally etched in the Y direction within the source/drain space 69, thereby forming cavities. The lateral amount of etching of the first semiconductor layer 20 is in a range from about 0.5 nm to about 10 nm in some embodiments, and is in a range from about 1 nm to about 5 nm in other embodiments.

When the first semiconductor layers 20 are SiGe and the second semiconductor layers 25 are Si, the first semiconductor layers 20 can be selectively etched by isotropic etching, such as wet etching. A wet etchant includes a mixed solution of $H_2O_2$, $CH_3COOH$ and HF, followed by $H_2O$ cleaning in some embodiments. In some embodiments, the etching by the mixed solution and cleaning by water is repeated 10 to 20 times. The etching time using the mixed solution is in a range from about 1 min to about 2 min in some embodiments. The mixed solution is used at a temperature in a range from about 60° C. to about 90° C. in some embodiments.

Then, a fifth dielectric layer is conformally formed on the etched lateral ends of the first semiconductor layers 20 and on end faces of the second semiconductor layers 25 in the source/drain space 69. The fifth dielectric layer includes one of silicon nitride and silicon oxide, SiON, SiOC, SiCN and SiOCN, or any other suitable dielectric material. The fifth dielectric layer is made of a different material than the sidewall spacers 65 in some embodiments. The fifth dielectric layer can be formed by ALD or any other suitable methods.

After the fifth dielectric layer is formed, an etching operation is performed to partially remove the fifth dielectric layer, thereby forming inner spacers 70, as shown in FIG. 18B. In some embodiments, the end face of the inner spacers 70 is recessed more than the end face of the second semiconductor layers 25. The recessed amount is in a range from about 0.2 nm to about 3 nm and in in a range from about 0.5 nm to about 2 nm in other embodiments. In other embodiments, the recessed amount is less than 0.5 nm and may be equal to zero (the end face of the inner spacer 70 and the end face of the second semiconductor layers 25 are flush with each other). In some embodiments, before forming the fifth dielectric layer, an additional dielectric layer having a smaller thickness than the fifth dielectric layer is formed, and thus the inner spacers 70 have a two-layer structure.

Subsequently, as shown in FIGS. 19A-19C, a source/drain epitaxial layer is formed in the source/drain space 69. The source/drain epitaxial layer includes one or more layers of SiP, SiAs, SiCP, SiPAs and/or SiC for an n-type FET, and SiGe, GeSn and/or SiGeSn for a p-type FET. For the p-type FET, the source/drain epitaxial layer is doped with B (boron) in some embodiments. In some embodiments, the source/drain epitaxial layer includes multiple layers.

In some embodiments, the source/drain epitaxial layer of an n-type FET includes a first epitaxial layer 82, a second epitaxial layer 84 and a third epitaxial layer 86. In some embodiments, the first epitaxial layer 82 is made of SiP, SiAs or SiAs:P or combination thereof. In some embodiments, the P concentration of the first epitaxial layer 82 is in a range from about $0.5 \times 10^{19}$ atoms/cm$^3$ to about $5 \times 10^{20}$ atoms/cm$^3$, and is in a range from about $0.8 \times 10^{19}$ atoms/cm$^3$ to about $2 \times 10^{20}$ atoms/cm$^3$ in other embodiments. In some embodiments, the second epitaxial layer 84 is made of SiP. In some embodiments, the P concentration of the second epitaxial layer 84 is higher than that of the first SiP epitaxial layer 82, and is in a range from about $1 \times 10^{21}$ atoms/cm$^3$ to about $5 \times 10^{21}$ atoms/cm$^3$, and is in a range from about $2 \times 10^{21}$ atoms/cm$^3$ to about $4 \times 10^{21}$ atoms/cm$^3$ in other embodiments. In some embodiments, the third epitaxial layer 86 is made of SiGeP. In some embodiments, the P concentration of the third epitaxial layer 86 is equal to or lower than that of the second SiP epitaxial layer 84 and higher than that of the first SiP epitaxial layer 82, and is in a range from about $0.5 \times 10^{21}$ atoms/cm$^3$ to about $4 \times 10^{21}$ atoms/cm$^3$, and is in a range from about $1 \times 10^{21}$ atoms/cm$^3$ to about $3 \times 10^{21}$ atoms/cm$^3$ in other embodiments. In some embodiments, the Ge concentration of the third epitaxial layer 86 is in a range from about 0.5 atomic % to 10 atomic %, and is in a range from about 1 atomic % to about 5 atomic % in other embodiments.

In some embodiments, the source/drain epitaxial layer of a p-type FET includes a first epitaxial layer 82, a second epitaxial layer 84 and a third epitaxial layer 86. In some embodiments, the first epitaxial layer 82 is made of SiGe doped with B. In some embodiments, the Ge content is in a range from about 15 atomic % to about 30 atomic %. In some embodiments, the B concentration of the first epitaxial layer 82 is in a range from about $1 \times 10^{19}$ atoms/cm$^3$ to about $1 \times 10^{21}$ atoms/cm$^3$, and is in a range from about $5 \times 10^{19}$ atoms/cm$^3$ to about $5 \times 10^{20}$ atoms/cm$^3$ in other embodiments. In some embodiments, the second epitaxial layer 84 is made of SiGe doped with B. In some embodiments, the Ge content of the second epitaxial layer 84 is in a range from about 20 atomic % to about 35 atomic % in some embodiments. In some embodiments, the B concentration of the second epitaxial layer 84 is equal to or higher than the largest B concentration of the first epitaxial layer 82, and is in a range from about $0.5 \times 10^{20}$ atoms/cm$^3$ to about $1 \times 10^{21}$ atoms/cm$^3$, and is in a range from about $1 \times 10^{20}$ atoms/cm$^3$ to about $5 \times 10^{20}$ atoms/cm$^3$ in other embodiments. In some embodiments, the third epitaxial layer 86 is made of SiGe doped with B. In some embodiments, the Ge content is in a range from 25 atomic % to about 60 atomic %. In some embodiments, the average Ge content of the third epitaxial layer is greater than the Ge content of the second epitaxial layer. In some embodiments, the B concentration of the third epitaxial layer 86 is in a range from about $5 \times 10^{19}$ atoms/cm$^3$ to about $5 \times 10^{21}$ atoms/cm$^3$, and is in a range from about $1 \times 10^{20}$ atoms/cm$^3$ to about $3 \times 10^{21}$ atoms/cm$^3$ in other embodiments.

The source/drain epitaxial layers are formed by an epitaxial growth method using CVD, ALD or molecular beam epitaxy (MBE).

After the source/drain epitaxial layers are formed, a sixth dielectric layer 90 is formed over the source/drain epitaxial layers, as shown in FIGS. 20A-20C. The sixth dielectric layer 90 includes one of silicon nitride and silicon oxide, SiON, SiOC, SiCN and SiOCN, or any other suitable dielectric material. Then, one or more planarization operations, such as a CMP operation, are performed to expose the upper surface of the sacrificial gate electrode 64 as shown in FIGS. 20B and 20C.

Then, the sacrificial gate electrode 64 and sacrificial gate dielectric layer 62 are removed as shown in FIGS. 21A-21C. The fifth dielectric layer 90 protects the source/drain epitaxial layers during the removal of the sacrificial gate structures. The sacrificial gate structures can be removed using plasma dry etching and/or wet etching. When the sacrificial gate electrode 64 is polysilicon, a wet etchant such as a TMAH solution can be used to selectively remove the sacrificial gate electrode 64. The sacrificial gate dielectric layer 62 is thereafter removed using plasma dry etching and/or wet etching.

After the sacrificial gate structures are removed, the sacrificial cladding layer 35 is removed by one or more dry and/or wet etching operations, as shown in FIGS. 22A-22C.

Then, the first semiconductor layers 20 are removed, thereby forming wires or sheets (channel regions) of the second semiconductor layers 25, as shown in FIGS. 23A-23C. The first semiconductor layers 20 can be removed or etched using an etchant that can selectively etch the first semiconductor layers 20 against the second semiconductor layers 25. As shown in FIG. 23B, since the inner spacers 70 are formed, the etching of the first semiconductor layers 20 stops at the inner spacers 70.

After the semiconductor wires or sheets (channel regions) of the second semiconductor layers 25 are released, a gate dielectric layer 102 is formed around each channel regions, and further, a gate electrode layer 104 is formed on the gate dielectric layer 102, as shown in FIGS. 24A-24C. In some embodiments, the structure and/or material of the gate electrode for the n-type GAA FET are different from the structure and/or material of the gate electrode for the p-type GAA FET.

In certain embodiments, the gate dielectric layer 102 includes one or more layers of a dielectric material, such as silicon oxide, silicon nitride, or high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 includes an interfacial layer (not shown) formed between the channel layers and the dielectric material. The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel layers. The thickness of the gate dielectric layer 102 is in a range from about 1 nm to about 6 nm in one embodiment.

The gate electrode layer 104 is formed on the gate dielectric layer 102 to surround each channel layer. The gate electrode 104 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 104 may be formed by CVD, ALD, electro-plating, or other suitable method. The gate dielectric layer and the gate electrode layer are then planarized by using, for example, CMP, until the top surfaces of the fifth dielectric layer 90 and the third dielectric layer 50 are revealed. In some embodiments, after the planarization operation, the gate electrode layer 104 is recessed and a cap insulating layer (not shown) is formed over the recessed gate electrode 104. The cap insulating layer includes one or more layers of a silicon nitride-based material, such as silicon nitride. The cap insulating layer can be formed by depositing an insulating material followed by a planarization operation.

In certain embodiments of the present disclosure, one or more work function adjustment layers (not shown) are interposed between the gate dielectric layer 102 and the gate electrode 104. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET, which may use different metal layers.

Next, as shown in FIGS. 24A-24C, the fourth dielectric layer 55 is removed by using a plasma etching operation. In some embodiments, the source gas of the plasma includes $C_4F_4$. In some embodiments, the fourth dielectric layer 55 is selectively removed from the third dielectric layer 50 to form a space 57.

Further, as shown in FIGS. 25A-25C, the remaining third dielectric layer 50 is treated by plasma to form a V-shape space 57. In some embodiments, the height of the third dielectric layer 50 is reduced by about 30%-70% of the original height. In some embodiments the remaining height of the third dielectric layer 50 is in a range from about 2 nm to about 6 nm. In some embodiments, the source gas of the plasma includes HBr.

Then, as shown in FIGS. 26A-26C, a part of the sixth dielectric layer 90 above the source/drain epitaxial layer 84 is etched to form a contact opening 92.

Subsequently, the contact opening 92 is filled with one or more conductive materials, thereby forming a source/drain contact 95, as shown in FIGS. 27A-27C. In some embodiments, the source/drain contact 95 includes a liner layer and a body metal layer. The liner layer includes one or more of Ti, TiN, WN, Ta, or TaN, and the body metal layer includes one or more of Cu, Al, Ni, Co, Ru, W or an alloy thereof.

Figure 27D:
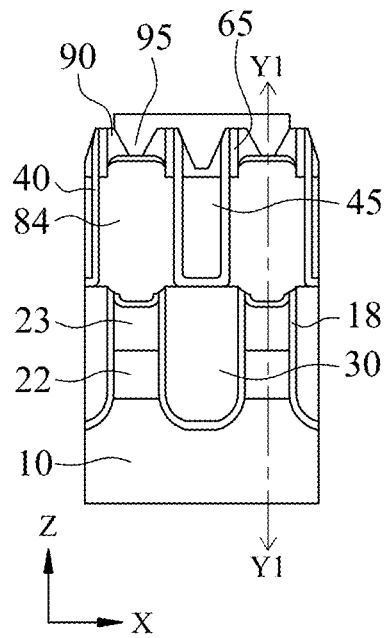
Figure 27E:
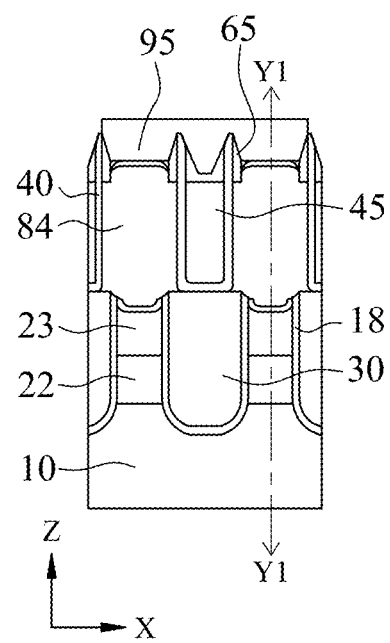
Figure 27F:
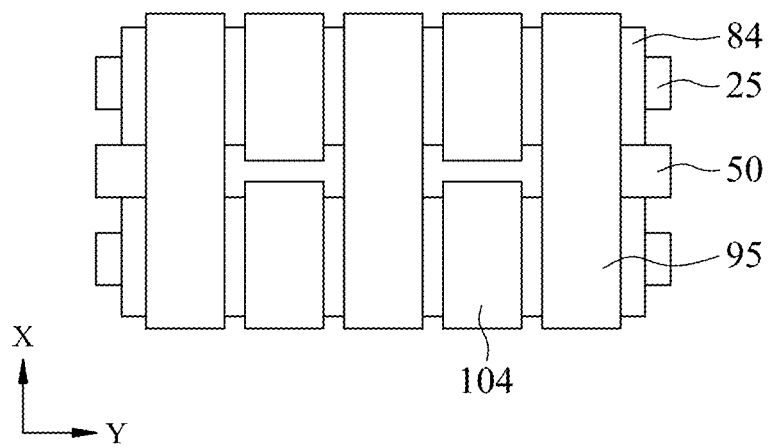

In some embodiments, as shown in FIG. 27D, the contact 95 connects adjacent source/drain regions. In such a case, a part of the contact 95 is disposed in the V-shape space 57 of the third dielectric layer. In some embodiments, as shown in FIGS. 27E, when forming the contact opening 92, part of the sidewall spacer 65 and/or the sidewall spacers 40 are also etched to form a wider opening, and then contact metal is formed in the wider opening to form the contact 95. In such a case, since the third dielectric layer 50 is recessed to form the V-shape, the aspect ratio of the V-shape portion is small, which improves the contact landing over the third dielectric layer. FIG. 27F is a plan (top) view corresponding to FIGS. 27D and 27E.

It is understood that the FET undergoes further CMOS processes to form various features such as contacts/vias, interconnect metal layers, dielectric layers, passivation layers, etc.

In some embodiments, the wall fin structure as set forth above is applicable to a FinFET. FIGS. 28-38C show various views of a sequential manufacturing operation of a FinFET device according to an embodiment of the present disclosure. It is understood that additional operations can be provided before, during, and after processes shown by FIGS. 28-38C and some of the operations described below can be replaced or eliminated, for additional embodiments of the method. The order of the operations/processes may be interchangeable. Materials, process, configurations and/or processes described with respect to the forgoing embodiments are employed in the following embodiments, and detailed description thereof may be omitted.

Figure 28:
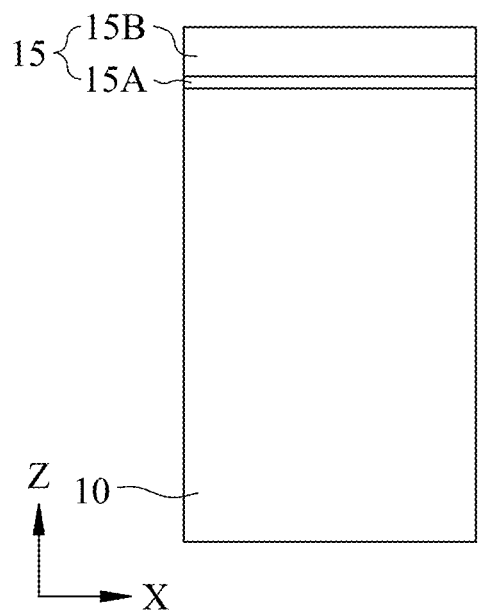
FIGS. 28, 29, 30, 31, 32, 33, 34, 35, 36 and 37 show cross sectional views of the various stages of manufacturing a semiconductor GAA FET device according to an embodiment of the present disclosure.

As shown in FIG. 28, a hard mask layer 15 including one or more layers of an insulating material or an amorphous semiconductor material (e.g., a-Si) is formed over the semiconductor substrate 10, similar to FIG. 1. In some embodiments, the hard mask layer 15 includes a first hard mask layer 15A and a second hard mask layer 15B. In some embodiments, the first hard mask layer 15A is silicon oxide having a thickness in a range from 1 nm to about 20 nm and the second hard mask layer 15B is silicon nitride having a thickness in a range from about 10 nm to about 100 nm.

Figure 29:
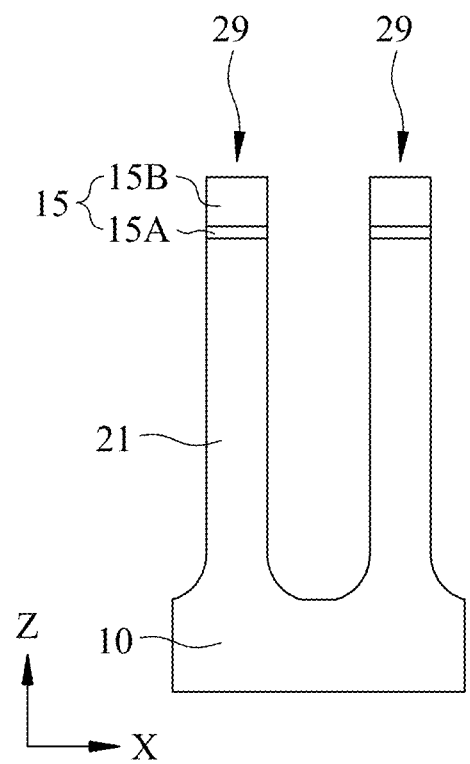
Figure 30:
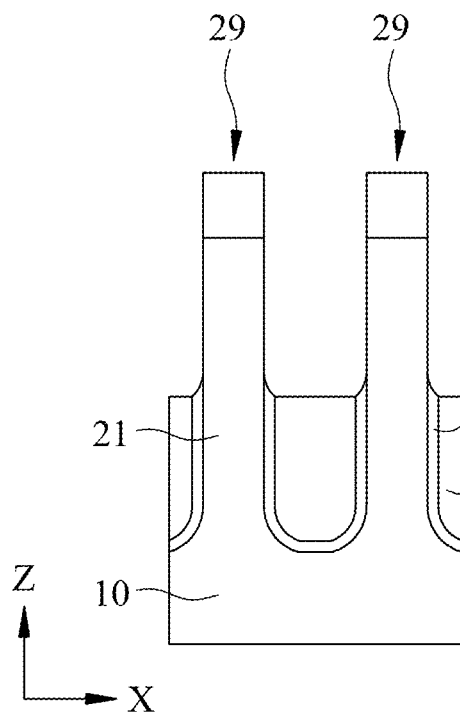

Then, similar to FIG. 2, fin structures 29 are formed by using one or more lithography and etching operations, as shown in FIG. 29. Further, similar to the operations as explained with FIGS. 3 and 4, an isolation insulating layer 30 is formed so that the upper portions of the fin structures 29 are exposed. The hard mask layer 15 remains on the top surface of the fin structure as shown in FIG. 30. In other embodiments, the hard mask layer 15 is removed during a planarization operation on the insulating layer 30 before recessing. In some embodiments, a liner layer 18 is disposed between the bottom 21 of the fin structure 29 and the isolation insulating layer 30.

Figure 31:
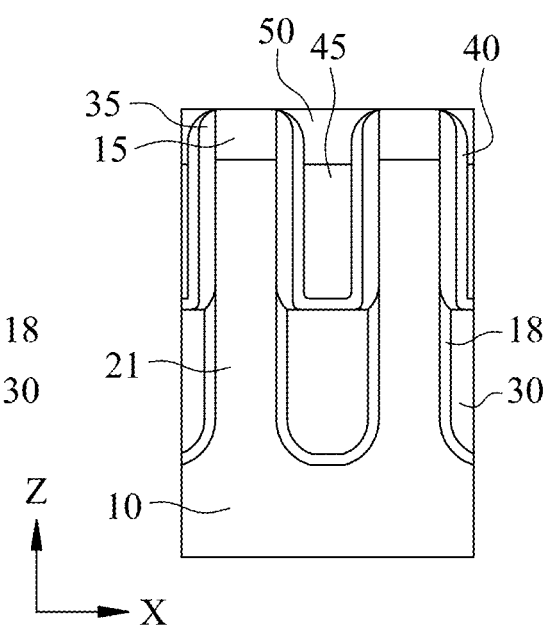

Further, similar to the operations as explained with FIGS. 5-9A, a sacrificial cladding layer 35 is formed over the exposed portion of the fin structures 29, and a wall fin structure (a dummy fin structure) formed by dielectric layers 40, 45 and 50 is formed between adjacent fin structures, as shown in FIG. 31.

Figure 32:
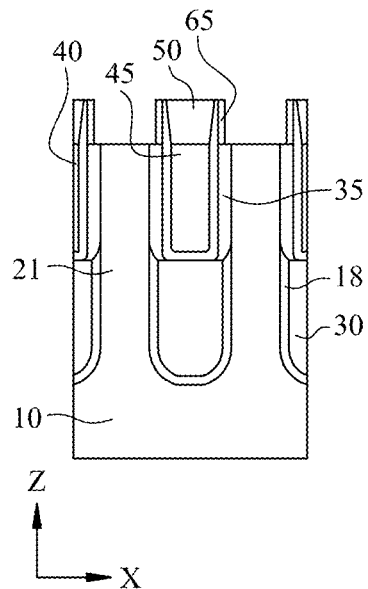

Then, similar to the operations as explained with FIGS. 10A-13A, sidewall spacers 65 are formed over the sacrificial gate electrodes, and the hard mask layer 15 is removed, as shown in FIG. 32.

Figure 33:
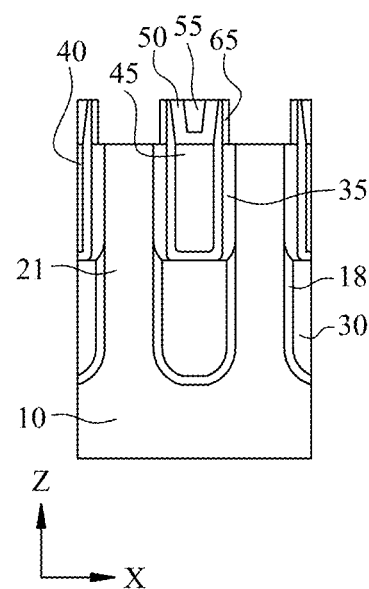

Further, similar to the operations as explained with FIGS. 14-16, the fourth dielectric layer 55 is formed in the recess formed in the third dielectric layer 50, as shown in FIG. 33.

Figure 34:
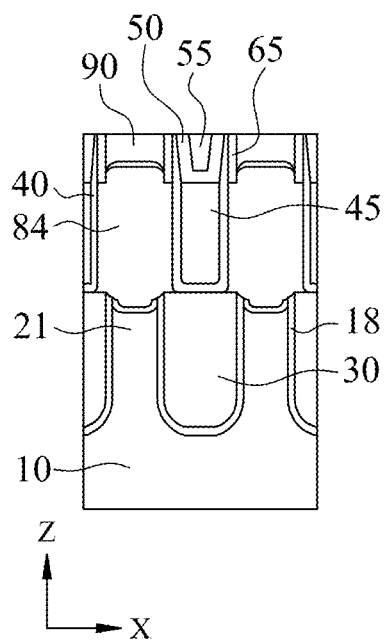

Further, similar to the operations as explained with FIGS. 17A-20A, the source/drain epitaxial layers are formed, and a sixth dielectric layer 90 is formed over the source/drain epitaxial layers, as shown in FIG. 34.

Figure 35:
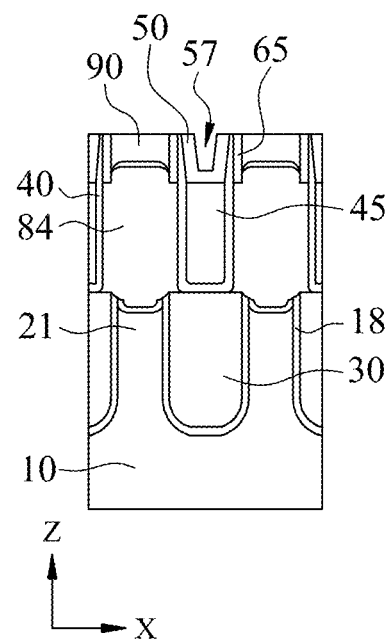
Figure 36:
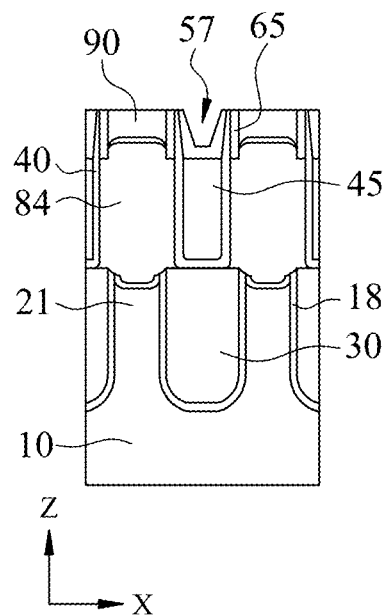

Next, similar to the operations as explained with FIGS. 24A-24C, the fourth dielectric layer 55 is removed by using a plasma etching operation, as shown in FIG. 35 to form a space 57. Further, similar to the operations as explained with FIGS. 25A-25C, the remaining third dielectric layer 50 is treated by plasma to form a V-shape space 57, as shown in FIG. 36.

Figure 37:
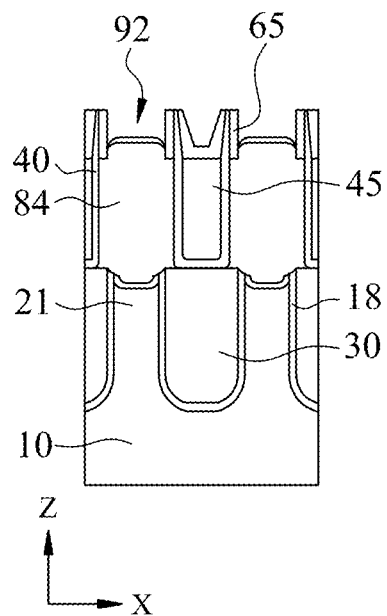

Then, similar to the operations as explained with FIGS. 26A-26C, a part of the sixth dielectric layer 90 above the source/drain epitaxial layer 84 is etched to form a contact opening 92, as shown in FIG. 37.

Figure 38A:
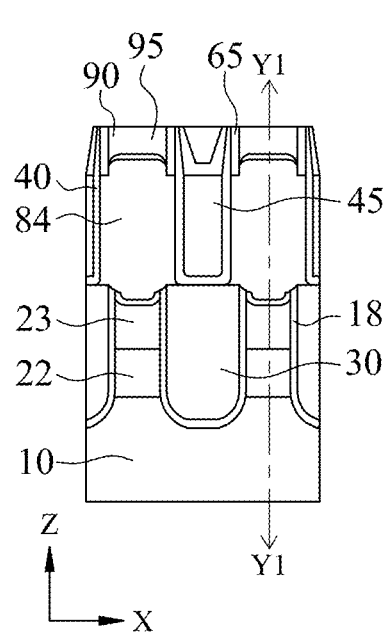
FIGS. 38A, 38B and 38C show various views of one of the various stages of manufacturing a semiconductor GAA FET device according to an embodiment of the present disclosure.
Figure 38B:
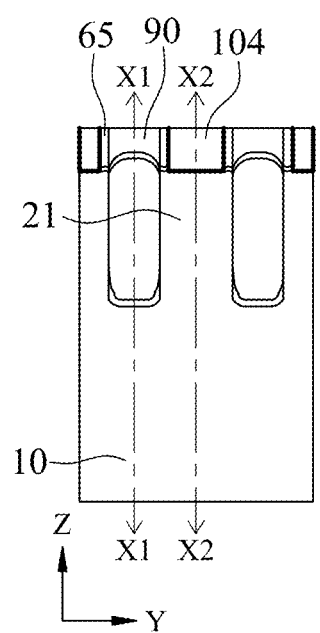
Figure 38C:
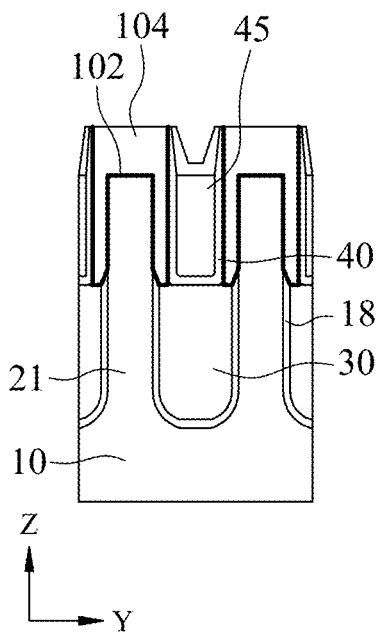

Subsequently, similar to the operations as explained with FIGS. 27A-27C, the contact opening 92 is filled with one or more conductive materials, thereby forming a source/drain contact 95, as shown in FIGS. 38A-38C.

It is understood that the FET undergoes further CMOS processes to form various features such as contacts/vias, interconnect metal layers, dielectric layers, passivation layers, etc.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a fin structure is formed. The fin structure includes a stacked layer of first semiconductor layers and second semiconductor layers disposed over a bottom fin structure and a hard mask layer over the stacked layer. An isolation insulating layer is formed so that the hard mask layer and the stacked layer are exposed from the isolation insulating layer. A sacrificial cladding layer is formed over at least sidewalls of the exposed hard mask layer and stacked layer. A first dielectric layer is formed. A second dielectric layer made of a different material than the first dielectric layer is formed over the first dielectric layer. The second dielectric layer is recessed. A third dielectric layer made of a different material than the second dielectric layer is formed on the recessed second dielectric layer. The third dielectric layer is partially removed to form a trench. A fourth dielectric layer is formed by filling the trench with a dielectric material different from the third dielectric layer, thereby forming a wall fin structure. In one or more of the foregoing or following embodiments, the first dielectric layer includes at least one of SiOC, SiOCN or SiCN. In one or more of the foregoing or following embodiments, the second dielectric layer includes at least one of silicon nitride, silicon oxide or SiON. In one or more of the foregoing or following embodiments, the third dielectric layer includes at least one of hafnium oxide, zirconium oxide, aluminum oxide or titanium oxide. In one or more of the foregoing or following embodiments, the fourth dielectric layer includes SiCN. In one or more of the foregoing or following embodiments, the trench is formed by plasma etching using a source gas including $C_4F_6$ and $CHF_3$. In one or more of the foregoing or following embodiments, when the fourth dielectric layer is formed, a blanket layer of the dielectric material for the fourth dielectric layer is formed, and an etching back operation using plasma etching is performed. In one or more of the foregoing or following embodiments, a source gas of the plasma etching includes $CH_3F$. In one or more of the foregoing or following embodiments, the sacrificial cladding layer is amorphous or polycrystalline Si or SiGe.

In accordance with another aspect of the present disclosure, in a method of manufacturing a semiconductor device, a fin structure is formed, an isolation insulating layer is formed so that an upper portion of the fin structure is exposed from the isolation insulating layer, a sacrificial layer is formed over at least sidewalls of the exposed upper portion of the fin structure, a first dielectric layer is formed, a second dielectric layer made of a different material than the first dielectric layer is formed over the first dielectric layer, the second dielectric layer is recessed, a third dielectric layer made of a different material than the second dielectric layer is formed on the recessed second dielectric layer, the third dielectric layer is partially removed to form a trench, and a fourth dielectric layer is formed by filling the trench with a dielectric material different from the third dielectric layer, thereby forming a wall fin structure. In one or more of the foregoing or following embodiments, a source/drain portion of the fin structure is recessed to form a recessed fin structure, a source/drain epitaxial layer is formed over the recessed fin structure, a fifth dielectric layer is formed over the source/drain epitaxial layer, the fourth dielectric layer is removed to form a space, a contact opening is formed in the fifth dielectric layer, and a source/drain contact is formed by filling the contact opening with one or more conductive materials. In one or more of the foregoing or following embodiments, after the fourth dielectric layer is removed, the space is treated with plasma so that the third dielectric layer has a V-shape cross section. In one or more of the foregoing or following embodiments, a source gas of the plasma includes HBr. In one or more of the foregoing or following embodiments, a part of the source/drain contact is formed over the third dielectric layer having a V-shape cross section. In one or more of the foregoing or following embodiments, the sacrificial layer is removed to expose a channel region of the fin structure, a gate dielectric layer is formed over the channel region, and a gate electrode is formed over the gate dielectric layer. In one or more of the foregoing or following embodiments, the fin structure includes a stacked layer of first semiconductor layers and second semiconductor layers disposed over a bottom fin structure. The sacrificial layer is removed to expose a channel region of the fin structure, the first semiconductor layers are removed thereby releasing semiconductor wires or sheets formed of the second semiconductor layers, a gate dielectric layer is formed around the semiconductor wires or sheets, and a gate electrode is formed over the gate dielectric layer. In one or more of the foregoing or following embodiments, the third dielectric layer includes hafnium oxide and the fourth dielectric layer includes SiCN.

In accordance with another aspect of the present disclosure, in a method of manufacturing a semiconductor device, fin structures are formed. Each of the fin structures includes a stacked layer of first semiconductor layers and second semiconductor layers disposed over a bottom fin structure and a hard mask layer over the stacked layer. An isolation insulating layer is formed so that the hard mask layer and the stacked layer are exposed from the isolation insulating layer. A sacrificial cladding layer is formed over at least sidewalls of the exposed hard mask layer and stacked layer. A first dielectric layer is formed so that the first dielectric layer does not fully filling a space between the fin structures. A second dielectric layer made of a different material than the first dielectric layer is formed over the first dielectric layer to fully fill the space between the fin structures. The second dielectric layer is recessed. A third dielectric layer made of a different material than the second dielectric layer is formed on the recessed second dielectric layer. The third dielectric layer is partially removed to form a trench. A fourth dielectric layer is formed by filling the trench with a dielectric material different from the third dielectric layer, thereby forming a wall fin structure. The hard mask layer is removed. A sacrificial gate structure is formed. Sidewall spacers are formed on sidewalls of the sacrificial gate structure and sidewalls of a part of the wall fin structure. A source/drain structure is formed. A fifth dielectric layer is formed. The sacrificial gate structure is removed. The sacrificial cladding layer is removed. The first semiconductor layers are removed. A metal gate structure is formed around the second semiconductor layers. In one or more of the foregoing or following embodiments, the third dielectric layer includes hafnium oxide and the fourth dielectric layer includes SiCN. In one or more of the foregoing or following embodiments, the fourth dielectric layer is removed to form a space. A contact opening is formed in the fifth dielectric layer. A source/drain contact is formed by filling the contact opening with one or more conductive materials.

In accordance with another aspect of the present disclosure, a semiconductor device includes a first source/drain epitaxial layer and a second source/drain epitaxial layer; and a wall fin disposed between the first source/drain epitaxial layer and the second source/drain epitaxial layer and disposed on an isolation insulating layer. The wall fin includes a first dielectric layer, a second dielectric layer disposed over the first dielectric layer and a third dielectric layer, the first, second and third dielectric layers are made of different materials from each other, and an upper surface of the third dielectric layer has a V-shape cross section. In one or more of the foregoing or following embodiments, the first dielectric layer does not fully fill a space between the first source/drain epitaxial layer and the second source/drain epitaxial layer, and the second dielectric layer fully fills the space. In one or more of the foregoing or following embodiments, the first dielectric layer is disposed between the second dielectric layer and each of the first and second source/drain epitaxial layers. In one or more of the foregoing or following embodiments, the first dielectric layer includes at least one of SiOC, SiOCN or SiCN. In one or more of the foregoing or following embodiments, the second dielectric layer includes at least one of silicon nitride, silicon oxide or SiON. In one or more of the foregoing or following embodiments, the third dielectric layer includes a dielectric material having a dielectric constant higher than the first and second dielectric layers and the isolation insulating layer. In one or more of the foregoing or following embodiments, the third dielectric layer includes at least one of hafnium oxide, zirconium oxide, aluminum oxide or titanium oxide.

In accordance with another aspect of the present disclosure, a semiconductor device includes a first source/drain epitaxial layer and a second source/drain epitaxial layer, a wall fin disposed between the first source/drain epitaxial layer and the second source/drain epitaxial layer and disposed on an isolation insulating layer, and a source/drain contact contacting the first source/drain epitaxial layer and the second source/drain epitaxial layer and disposed over the wall fin. The wall fin includes a first dielectric layer, a second dielectric layer disposed over the first dielectric layer and a third dielectric layer, the first, second and third dielectric layers are made of different materials from each other, and the third dielectric layer has a V-shape recess. In one or more of the foregoing or following embodiments, the first dielectric layer does not fully fill a space between the first source/drain epitaxial layer and the second source/drain epitaxial layer, and the second dielectric layer fully fills the space. In one or more of the foregoing or following embodiments, the first dielectric layer is disposed between the second dielectric layer and each of the first and second source/drain epitaxial layers. In one or more of the foregoing or following embodiments, the first dielectric layer includes at least one of SiOC, SiOCN or SiCN. In one or more of the foregoing or following embodiments, the second dielectric layer includes at least one of silicon nitride, silicon oxide or SiON. In one or more of the foregoing or following embodiments, the third dielectric layer includes hafnium oxide. In one or more of the foregoing or following embodiments, the source/drain contact fully fills the V-shape recess.

In accordance with another aspect of the present disclosure, a semiconductor device includes a first gate-all-around field effect transistor (GAA FET) and a second GAA FET; and a wall fin disposed between the first GAA FET and the second GAA FET and disposed on an isolation insulating layer. Each of the first GAA FET and the second GAA FET includes semiconductor wires or sheets, a gate dielectric layer wrapping around channel regions of the semiconductor wires or sheets, a gate electrode on the gate dielectric layer, a source/drain epitaxial layer and a source/drain contact in contact with the source/drain epitaxial layer. The wall fin includes a first dielectric layer, a second dielectric layer disposed over the first dielectric layer and a third dielectric layer, the first, second and third dielectric layers are made of different materials from each other, and the third dielectric layer includes a dielectric material having a dielectric constant higher than the first and second dielectric layers and the isolation insulating layer. The source/drain contact of the first GAA FET and the source/drain contact of the second GAA FET is connected by a connecting portion disposed over the third dielectric layer. In one or more of the foregoing or following embodiments, each of the first GAA FET and the second GAA FET further includes a fourth dielectric layer different from the first, second and third dielectric layers disposed on the source/drain epitaxial layer. In one or more of the foregoing or following embodiments, the third dielectric layer has a V-shape recess. In one or more of the foregoing or following embodiments, the first dielectric layer includes at least one of SiOC, SiOCN or SiCN. In one or more of the foregoing or following embodiments, the second dielectric layer includes at least one of silicon nitride, silicon oxide or SiON. In one or more of the foregoing or following embodiments, the third dielectric layer includes at least one of hafnium oxide, zirconium oxide, aluminum oxide or titanium oxide.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
  a first source/drain epitaxial layer and a second source/drain epitaxial layer;
  a wall fin disposed between the first source/drain epitaxial layer and the second source/drain epitaxial layer and disposed on an isolation insulating layer; and
  a source/drain contact contacting the first source/drain epitaxial layer and the second source/drain epitaxial layer and disposed over the wall fin, wherein:

the wall fin includes a first dielectric layer, a second dielectric layer disposed over the first dielectric layer and a third dielectric layer, the first, second, and third dielectric layers are made of different materials from each other, and the third dielectric layer has a V-shape recess.

2. The semiconductor device according to claim 1, wherein the first dielectric layer includes at least one of SiOC, SiOCN or SiCN.

3. The semiconductor device according to claim 1, wherein the second dielectric layer includes at least one of silicon nitride, silicon oxide or SiON.

4. The semiconductor device according to claim 1, wherein the third dielectric layer includes at least one of hafnium oxide, zirconium oxide, aluminum oxide or titanium oxide.

5. The semiconductor device according to claim 1, wherein the first dielectric layer does not fully fill a space between the first source/drain epitaxial layer and the second source/drain epitaxial layer, and the second dielectric layer fully fills the space.

6. The semiconductor device according to claim 5, wherein the first dielectric layer is disposed between the second dielectric layer and each of the first and second source/drain epitaxial layers.

7. The semiconductor device according to claim 1, wherein a part of the source/drain contact is formed over the third dielectric layer having the V-shape recess when viewed in cross section.

8. The semiconductor device according to claim 7, wherein the source/drain contact fully fills the V-shape recess.

9. The semiconductor device according to claim 1, wherein the third dielectric layer includes a dielectric material having a dielectric constant higher than the first and second dielectric layers and the isolation insulating layer.

10. A semiconductor device comprising:

a first gate-all-around field effect transistor (GAA FET) and a second GAA FET; and a wall fin disposed between the first GAA FET and the second GAA FET and disposed on an isolation insulating layer, wherein:

each of the first GAA FET and the second GAA FET includes semiconductor wires or sheets, a gate dielectric layer wrapping around channel regions of the semiconductor wires or sheets, a gate electrode on the gate dielectric layer, a source/drain epitaxial layer and a source/drain contact in contact with the source/drain epitaxial layer, the wall fin includes a first dielectric layer, a second dielectric layer disposed over the first dielectric layer, and a third dielectric layer, the first, second, and third dielectric layers are made of different materials from each other, the third dielectric layer includes a dielectric material having a dielectric constant higher than the first and second dielectric layers and the isolation insulating layer, and the source/drain contact of the first GAA FET and the source/drain contact of the second GAA FET is connected by a connecting portion disposed over the third dielectric layer.

11. The semiconductor device according to claim 10, wherein the first dielectric layer includes at least one of SiOC, SiOCN or SiCN.

12. The semiconductor device according to claim 10, wherein the second dielectric layer includes at least one of silicon nitride, silicon oxide or SiON.

13. The semiconductor device according to claim 10, wherein the third dielectric layer includes at least one of hafnium oxide, zirconium oxide, aluminum oxide or titanium oxide.

14. The semiconductor device according to claim 10, wherein the first dielectric layer does not fully fill a space between a first source/drain epitaxial layer of the first GAA FET and a second source/drain epitaxial layer of the second GAA FET, and the second dielectric layer fully fills the space.

15. The semiconductor device according to claim 14, wherein the first dielectric layer is disposed between the second dielectric layer and each of the first and second source/drain epitaxial layers.

16. A semiconductor device comprising:

a first source/drain epitaxial layer and a second source/drain epitaxial layer;

a wall fin disposed between the first source/drain epitaxial layer and the second source/drain epitaxial layer and disposed on an isolation insulating layer, wherein:

the wall fin includes a first dielectric layer, a second dielectric layer disposed over the first dielectric layer and a third dielectric layer disposed over the second dielectric layer, the first, second, and third dielectric layers are made of different materials from each other, and an upper surface of the third dielectric layer has a V-shape cross section.

17. The semiconductor device of claim 16, wherein:

the first dielectric layer does not fully fill a space between the first source/drain epitaxial layer and the second source/drain epitaxial layer, and the second dielectric layer fully fills the space.

18. The semiconductor device of claim 16, wherein the first dielectric layer is disposed between the second dielectric layer and each of the first and second source/drain epitaxial layers.

19. The semiconductor device of claim 16, wherein the third dielectric layer includes a dielectric material having a dielectric constant higher than the first and second dielectric layers.

20. The semiconductor device of claim 16, wherein the third dielectric layer includes a dielectric material having a dielectric constant higher than the isolation insulating layer.

\* \* \* \* \*